United States Patent
Chen et al.

(10) Patent No.: US 11,949,014 B2
(45) Date of Patent: Apr. 2, 2024

(54) FIN FIELD EFFECT TRANSISTOR (FINFET) DEVICE STRUCTURE AND METHOD FOR FORMING THE SAME

(71) Applicant: Taiwan Semiconductor Manufacturing Company, Ltd., Hsinchu (TW)

(72) Inventors: Wei-Barn Chen, Tainan (TW); Ting-Huang Kuo, Tainan (TW); Shiu-Ko Jangjian, Tainan (TW); Chi-Cherng Jeng, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/722,514

(22) Filed: Apr. 18, 2022

(65) Prior Publication Data
US 2022/0238716 A1    Jul. 28, 2022

Related U.S. Application Data

(60) Continuation of application No. 16/396,852, filed on Apr. 29, 2019, now Pat. No. 11,309,423, which is a
(Continued)

(51) Int. Cl.
*H01L 29/78* (2006.01)
*H01L 21/762* (2006.01)
(Continued)

(52) U.S. Cl.
CPC .... *H01L 29/7851* (2013.01); *H01L 21/76229* (2013.01); *H01L 21/823412* (2013.01);
(Continued)

(58) Field of Classification Search
CPC .......... H01L 21/823431; H01L 21/845; H01L 27/0924; H01L 27/10826; H01L 21/76229;
(Continued)

(56) References Cited

U.S. PATENT DOCUMENTS 8,772,109 B2    7/2014  Colinge
8,785,285 B2    7/2014  Tsai et al.
(Continued)

FOREIGN PATENT DOCUMENTS

| CN | 105470295 A | 4/2016 |
| CN | 105814672 A | 7/2016 |
| TW | 201635352 A | 10/2016 |

OTHER PUBLICATIONS

Chinese language office action dated May 4, 2018, issued in application No. TW 106135928.
(Continued)

*Primary Examiner* — Shahed Ahmed
(74) *Attorney, Agent, or Firm* — McClure, Qualey & Rodack, LLP

(57) ABSTRACT

A FinFET device structure and method for forming the same are provided. The FinFET device structure includes a first, second, third and fourth fin structures over a substrate. The first and the second fin structures have a first and a second sidewall surfaces respectively. The third and the fourth fin structure have a third and a fourth sidewall surfaces respectively. The first and the second sidewall surfaces extend along a first direction. The third and the fourth sidewall surfaces extend along a second direction different from the first direction. A first and a second isolation structures are over the substrate and surrounding the first and the second fin structure and surrounding the third and the fourth fin structures respectively. A distance between top portions of
(Continued)

the third and the fourth sidewall surfaces is greater than that between top portions of the first and the second sidewall surfaces.

20 Claims, 26 Drawing Sheets

Related U.S. Application Data division of application No. 15/692,085, filed on Aug. 31, 2017, now Pat. No. 10,276,720.

(51) Int. Cl.
    *H01L 21/8234* (2006.01)
    *H01L 27/06* (2006.01)
    *H01L 27/088* (2006.01)
    *H01L 29/66* (2006.01)
    *H01L 49/02* (2006.01)

(52) U.S. Cl.
    CPC ........ *H01L 21/823431* (2013.01); *H01L 21/823481* (2013.01); *H01L 27/0629* (2013.01); *H01L 27/0886* (2013.01); *H01L 28/40* (2013.01); *H01L 29/66795* (2013.01); *H01L 29/7853* (2013.01)

(58) Field of Classification Search
    CPC ......... H01L 21/823481; H01L 27/0629; H01L 28/40; H01L 21/6224; H01L 27/0886; H01L 29/785–7856; H01L 29/66795–66818; H01L 27/10879; H01L 27/1211; H01L 29/41791; H01L 29/7851; H01L 29/04–045; H01L 21/30604–30621; H01L 21/76224–76237; H01L 21/823878
    See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,786,510 B2 | 10/2017 | Shen et al. | |
| 9,818,648 B2 | 11/2017 | Chao et al. | |
| 10,950,488 B2 | 3/2021 | Kim et al. | |
| 2008/0128797 A1 | 6/2008 | Dyer et al. | |
| 2013/0102116 A1 | 4/2013 | Xiao et al. | |
| 2013/0200395 A1* | 8/2013 | Liaw | H10B 10/12 257/77 |
| 2014/0001562 A1* | 1/2014 | Liaw | H01L 27/0924 257/E21.616 |
| 2015/0028426 A1* | 1/2015 | Ching | H01L 29/66795 438/283 |
| 2015/0187634 A1* | 7/2015 | Chiang | H01L 21/823481 438/433 |
| 2016/0104705 A1* | 4/2016 | Chung | H01L 27/1211 257/401 |
| 2017/0358455 A1* | 12/2017 | Shen | H01L 21/823431 |
| 2018/0090335 A1* | 3/2018 | Karve | H01L 21/3086 |
| 2018/0323281 A1* | 11/2018 | Cheng | H01L 21/823481 |
| 2020/0013777 A1* | 1/2020 | Kim | H01L 27/0207 |

OTHER PUBLICATIONS

Chinese language office action dated Apr. 6, 2021, issued in application No. CN 201711217315.1.

\* cited by examiner

FIN FIELD EFFECT TRANSISTOR (FINFET) DEVICE STRUCTURE AND METHOD FOR FORMING THE SAME

CROSS REFERENCE TO RELATED APPLICATIONS

This application is a Continuation of U.S. patent application Ser. No. 16/396,852, filed Apr. 29, 2019 and entitled "FIN FIELD EFFECT TRANSISTOR (FINFET) DEVICE STRUCTURE AND METHOD FOR FORMING THE SAME", (now U.S. Pat. No. 11,309,423, issued on Apr. 19, 2022), which is a Divisional of U.S. patent application Ser. No. 15/692,085, filed on Aug. 31, 2017 (now U.S. Pat. No. 10,276,720, issued on Apr. 30, 2019), the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
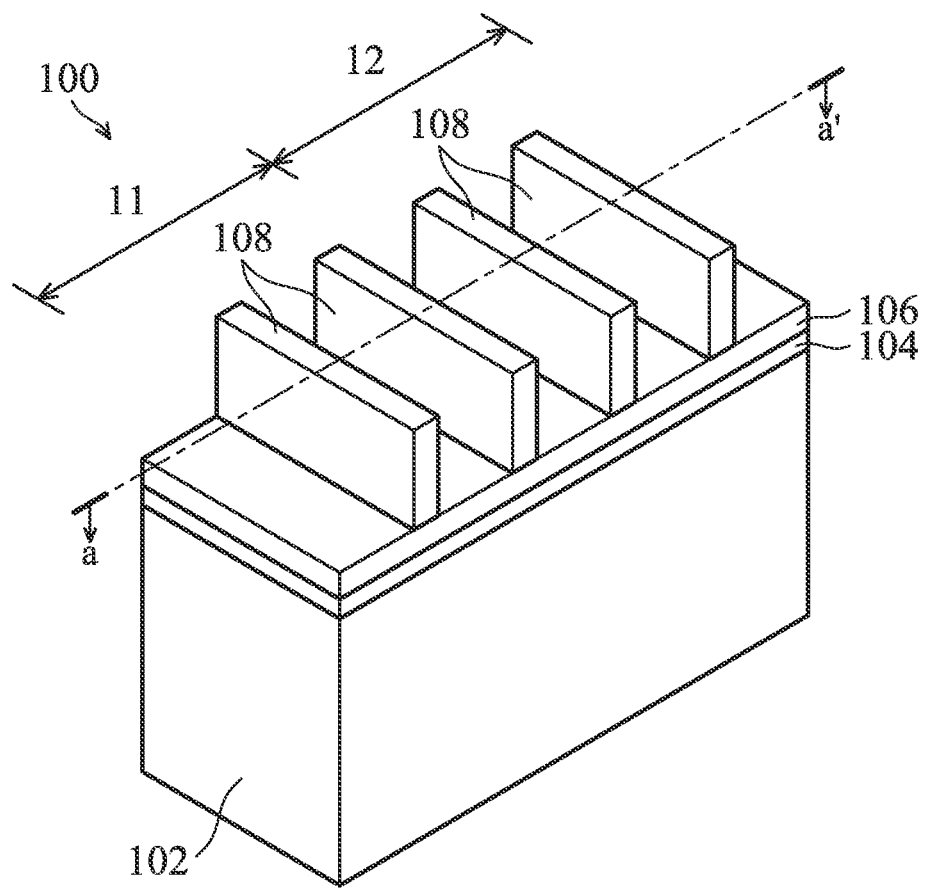
FIGS. 1A-1I show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1I show perspective representations of various stages of forming a FinFET device structure 100, in accordance with some embodiments of the disclosure. FIGS. 2A-2I show cross-sectional representations of various stages of forming the FinFET device structure 100 shown in FIGS. 1A-1I. FIGS. 2A-2I show cross-sectional representations taken along line aa' in FIGS. 1A-1I.

Referring to FIG. 1A, a substrate 102 is provided. The substrate 102 includes a first region 11 and a second region 12. The substrate 102 may be made of silicon or other semiconductor materials. In some embodiments, the substrate 102 is a silicon wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 2A:
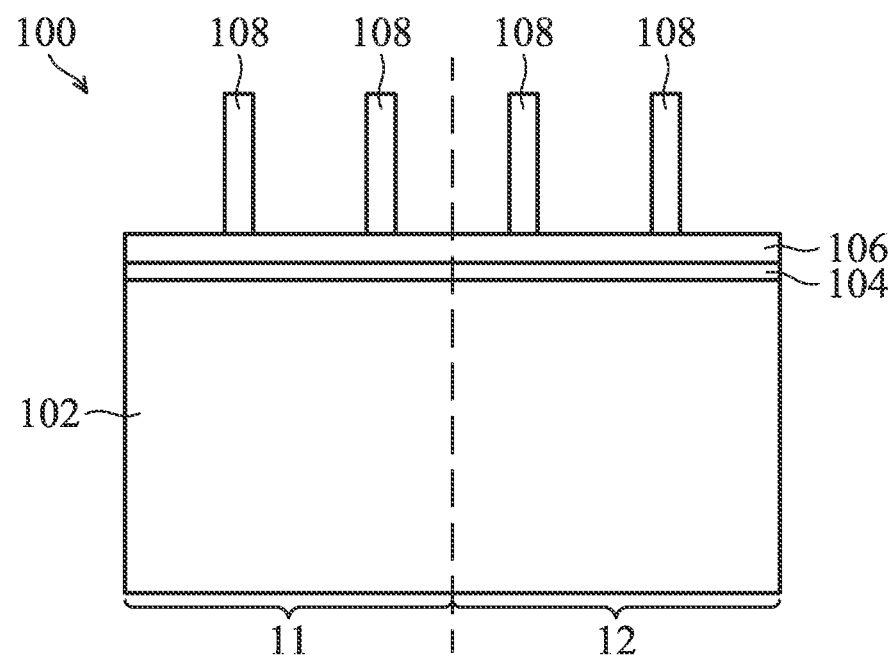
FIGS. 2A-2I show cross-sectional representations of various stages of forming the FinFET device structure shown in FIGS. 1A-1I.
Figure 1B:
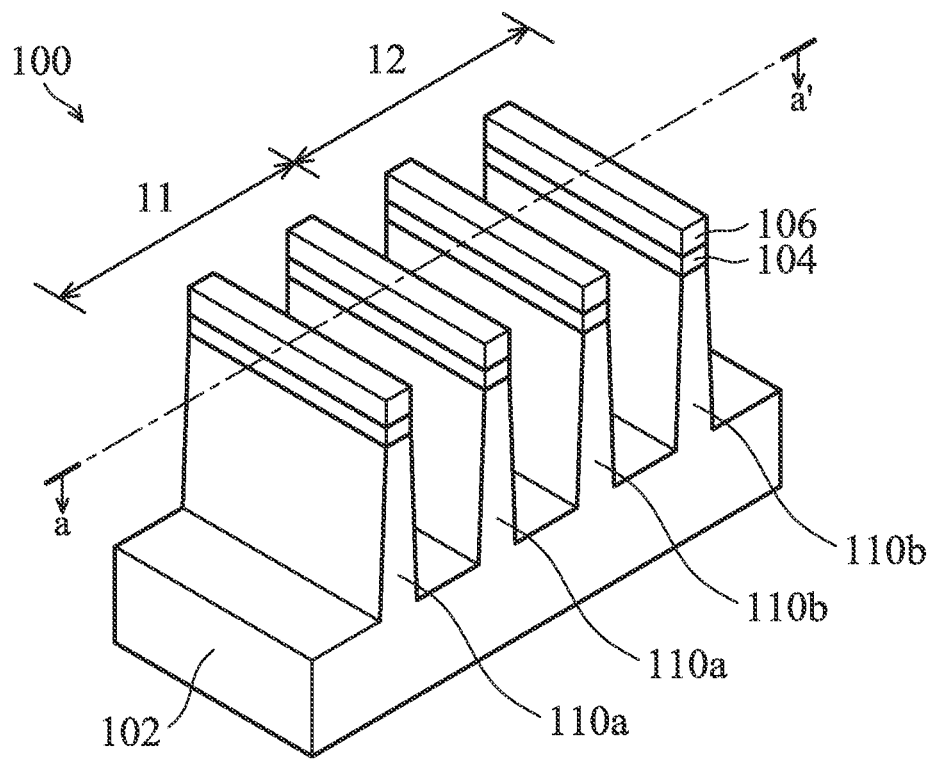
Figure 2B:
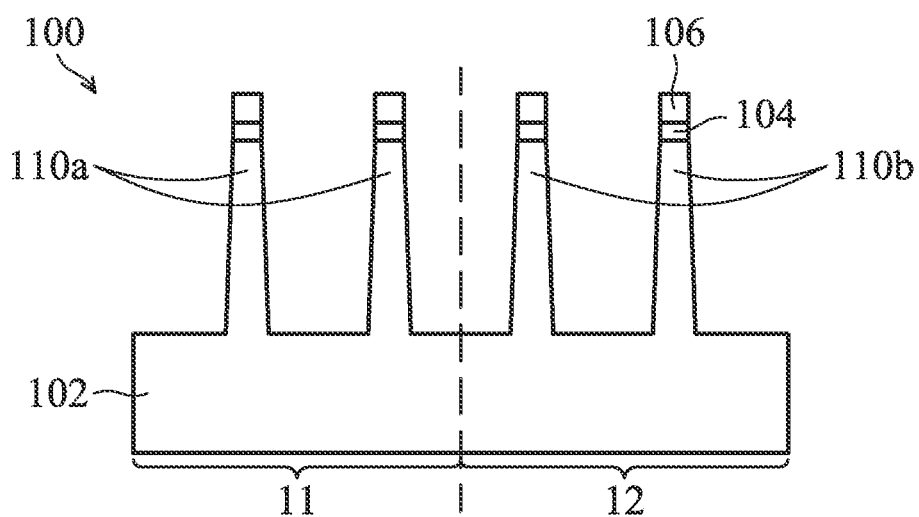

As shown in FIGS. 1B and 2B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Afterwards, an etching process is performed on the substrate 102 to form a number of fin structures 110a, 110b by using the patterned dielectric layer 104 and the patterned mask layer 106 as a mask. The fin structures 110a, 110b include first fin structures 110a in the first region 11 and second fin structures 110b in the second region 12. In some embodiments, each of the fin structures 110a, 110b has a width that gradually increases from the top portion to the bottom portion. In other words, each of the fin structures 110a, 110b has a tapered fin width which is gradually tapered from the bottom portion to the top portion.

The etching process may be a dry etching process or a wet etching process. In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structures 110a, 110b reach a predetermined height.

Before forming the isolation layer 112 (shown in FIG. 3C), a thermal oxidation process may be optionally performed on the fin structures 110a, 110b to repair any damage to the sidewall surfaces of the fin structures 110a, 110b during the etching process. It should be noted that although only four fin structures 110a, 110b shown in FIGS. 1A-1I and FIGS. 2A-2I, the number of the fin structures 110a, 110b may be changed according to actual application.

Figure 1C:
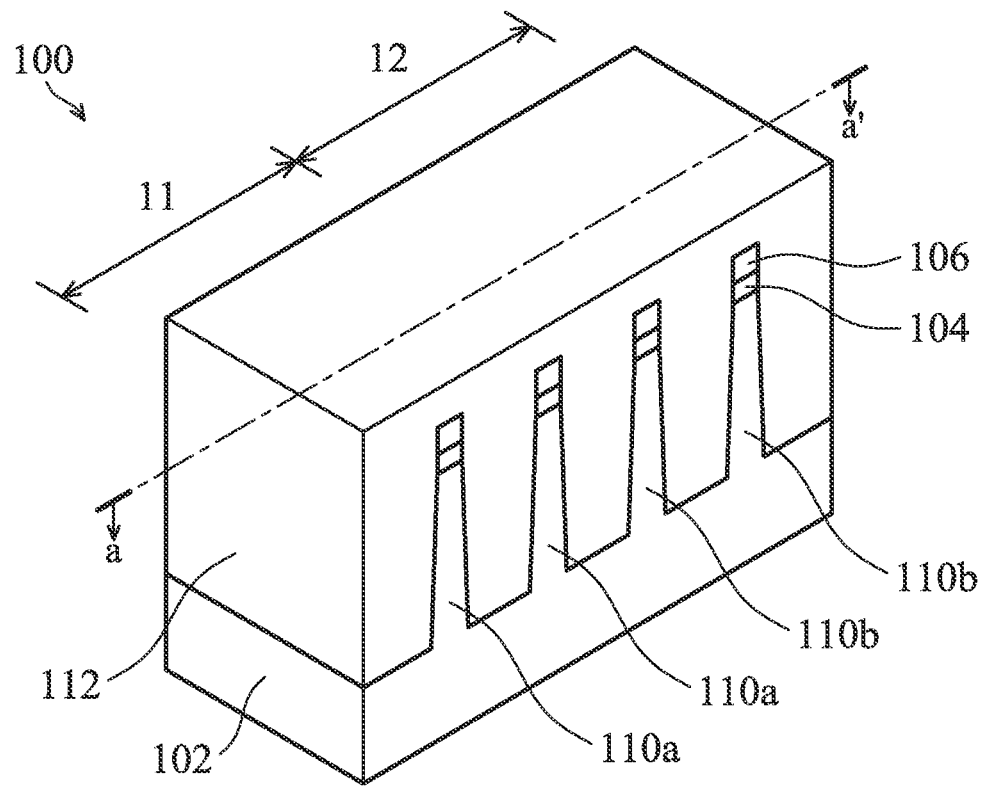
Figure 2C:
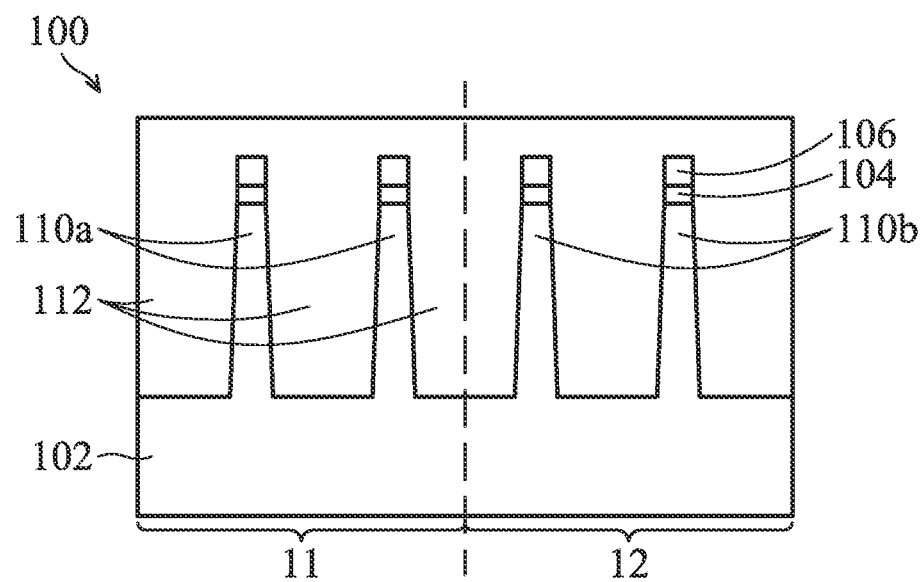

As shown in FIGS. 1C and 2C, after the fin structures 110a, 110b are formed, the isolation layer 112 is formed to cover the fin structures 110a, 110b over the substrate 102, in accordance with some embodiments.

In some embodiments, the isolation layer 112 is made of silicon oxide, silicon nitride, silicon oxynitride, fluoride-doped silicate glass (FSG), or another low-k dielectric material. The isolation layer 112 may be deposited by a deposition process, such as a chemical vapor deposition (CVD) process, a spin-on-glass process, or another applicable process.

Figure 1D:
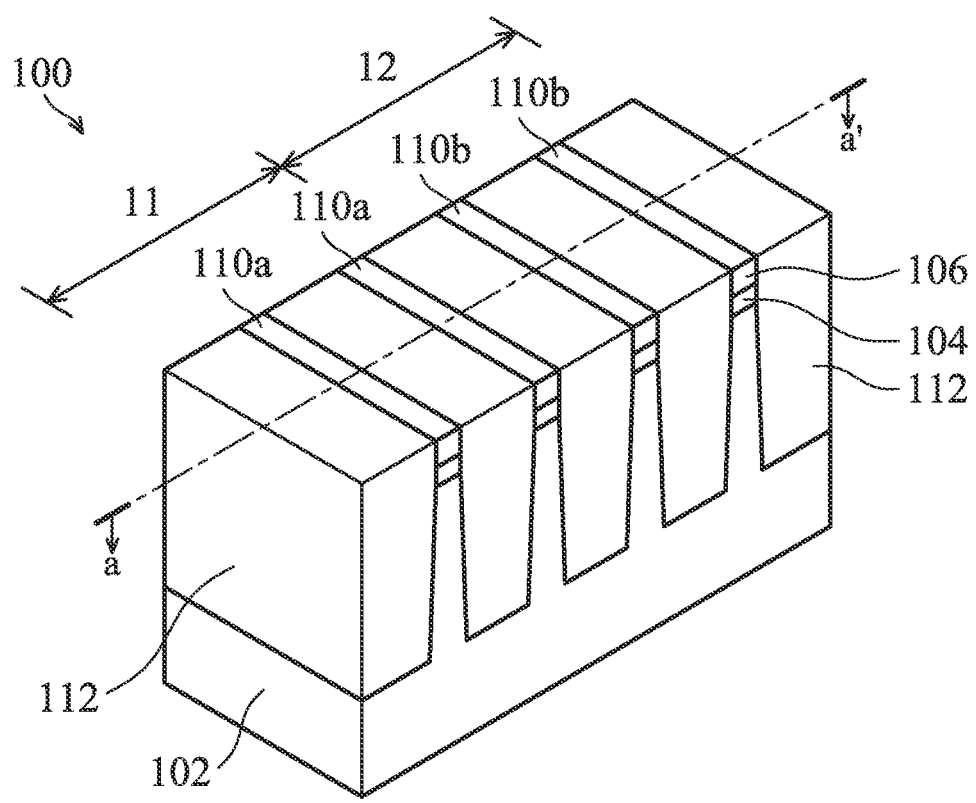
Figure 2D:
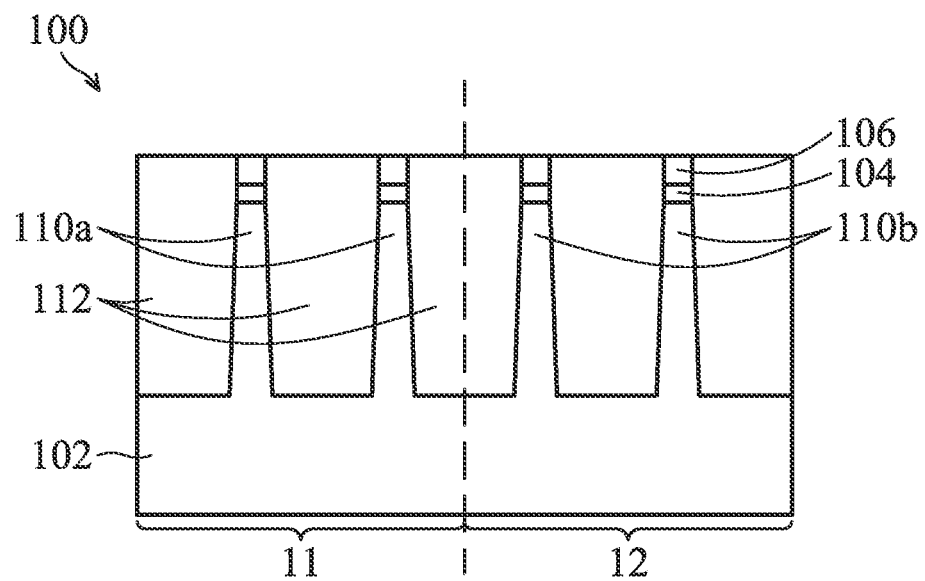

Afterwards, as shown in FIGS. 1D and 2D, the isolation layer 112 is thinned or planarized to expose the top surface of the patterned mask layer 106. In some embodiments, the insulating layer 112 is thinned by a chemical mechanical polishing (CMP) process.

Figure 1E:
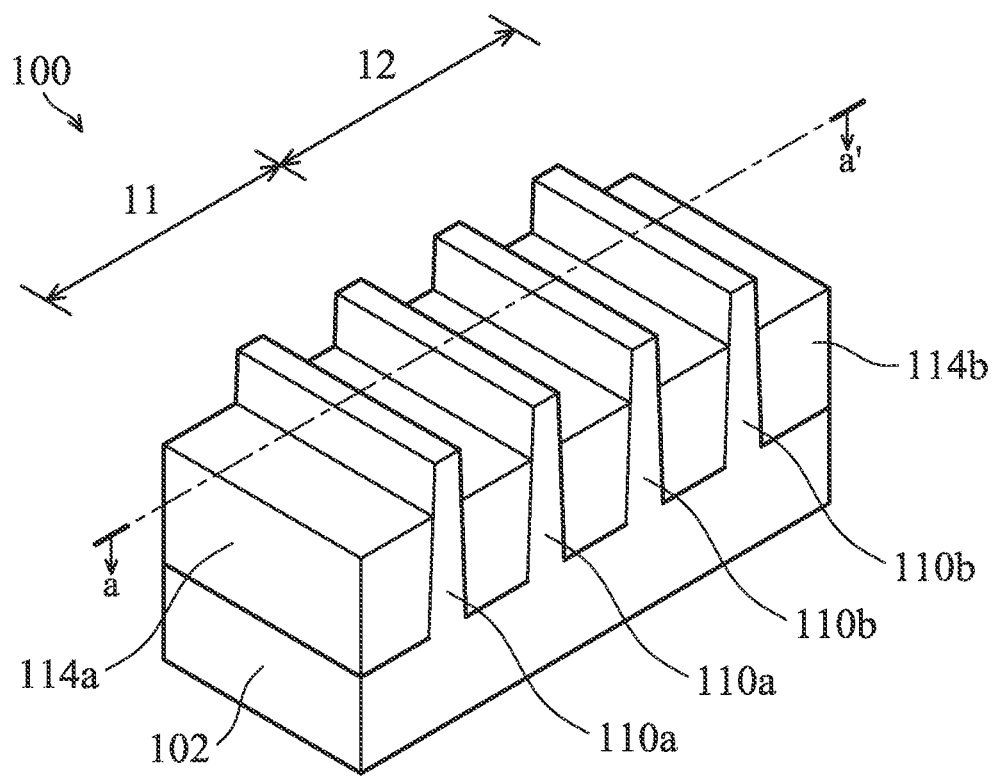
Figure 2E:
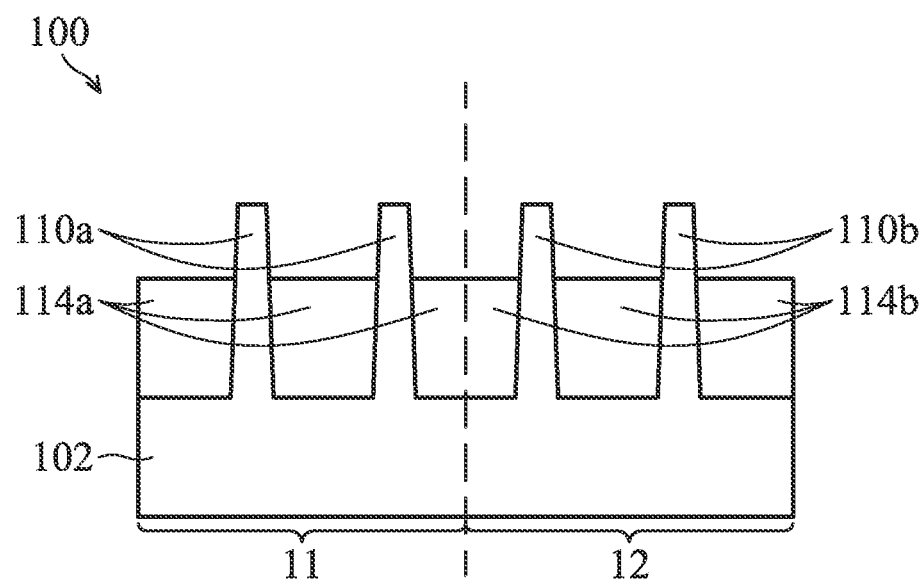

Afterwards, as shown in FIGS. 1E and 2E, a portion of the insulating layer 112 is removed to form a number of isolation structures 114a, 114b, in accordance with some embodiments. In addition, the patterned dielectric layer 104 and the patterned mask layer 106 are removed. The isolation structures 114a, 114b include first isolation structures 114a over the first region 11 and second isolation structures 114b over the second region 12. The isolation structures 114a, 114b may be a shallow trench isolation (STI) structure surrounding the fin structures 110a, 110b.

A lower portion of each of the fin structures 110a, 110b is surrounded by each of the isolation structures 114a, 114b, and an upper portion of each of the fin structures 110a, 110b protrudes from each of the isolation structures 114a, 114b. In other words, a portion of each of the fin structures 110a, 110b is embedded in each of the isolation structures 114a, 114b. The isolation structures 114a, 114b prevent electrical interference or crosstalk.

Figure 1F:
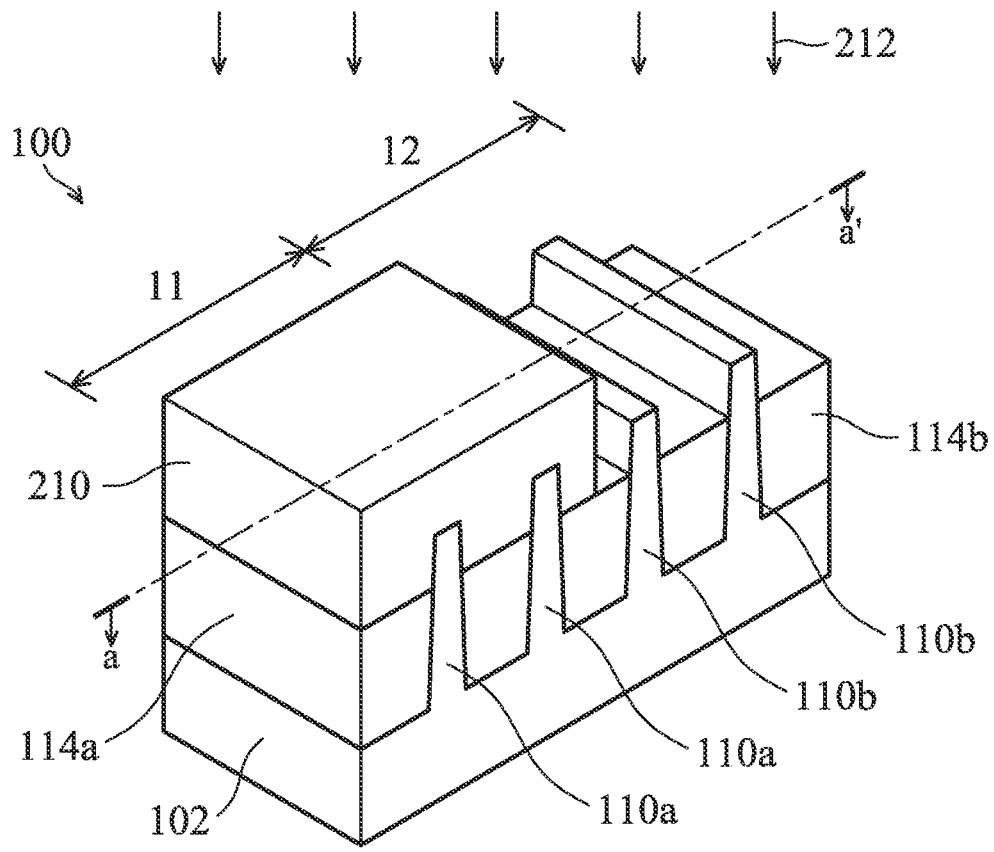
Figure 2F:
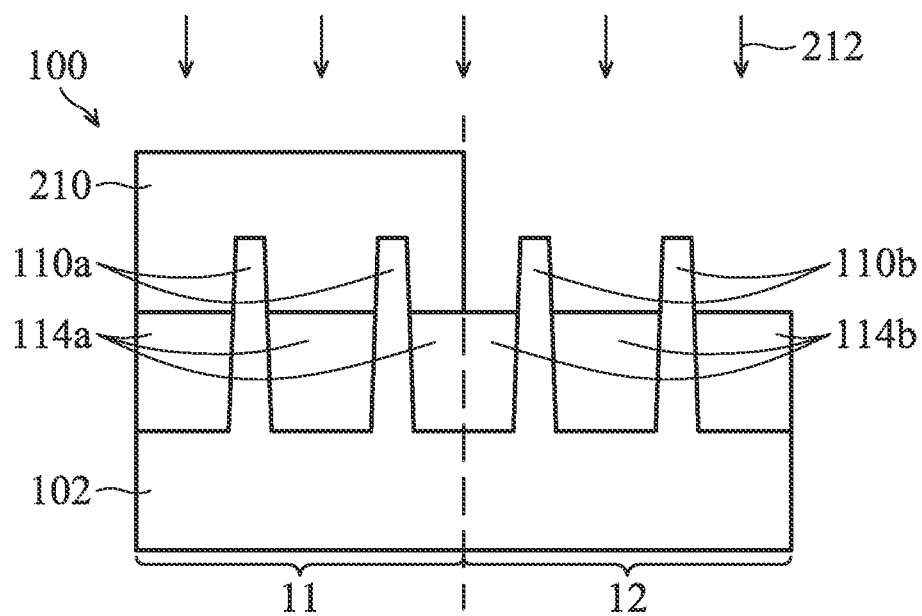

Afterwards, as shown in FIGS. 1F and 2F, a mask layer 210 is formed over the first fin structures 110a and the first isolation structures 114a, and a portion of the second isolation structures 114b is removed, in accordance with some embodiments. In some embodiments, an etching process 212 is performed on the second isolation structures 114b to remove the portion of the second isolation structures 114b.

The mask layer 210 covers the first isolation structures 114a, but the second isolation structures 114b are exposed. In some embodiments, the mask layer 210 is made of photoresist materials, such as polybenzoxazole (PBO), SU-8-photo-sensitive epoxy, film type polymer materials and/or the like.

Figure 1G:
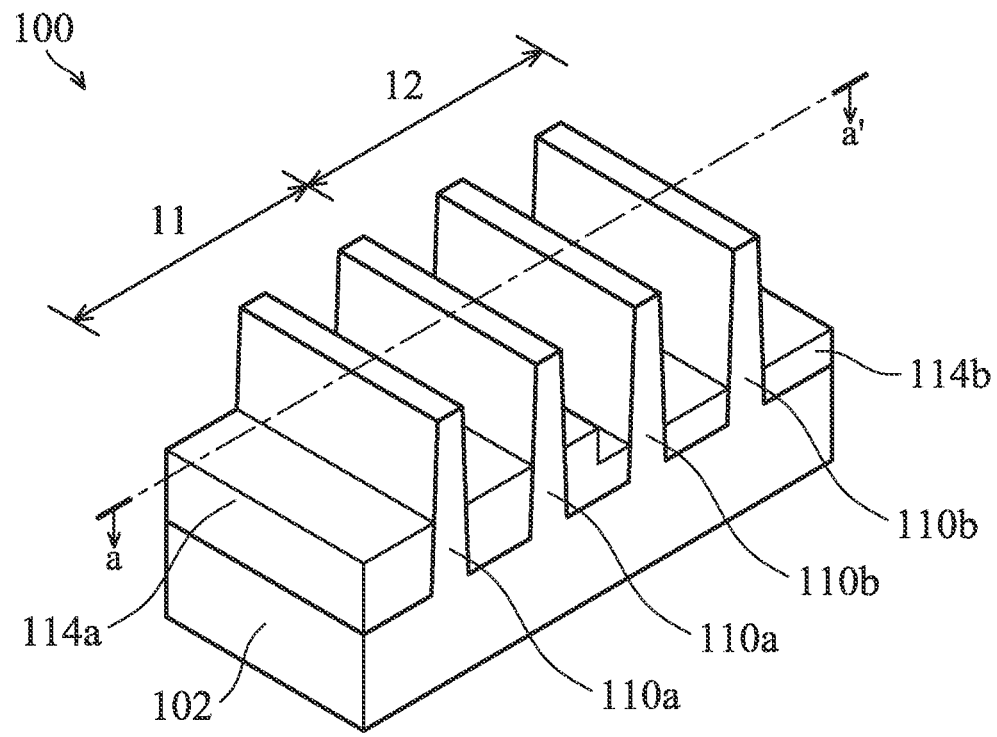
Figure 2G:
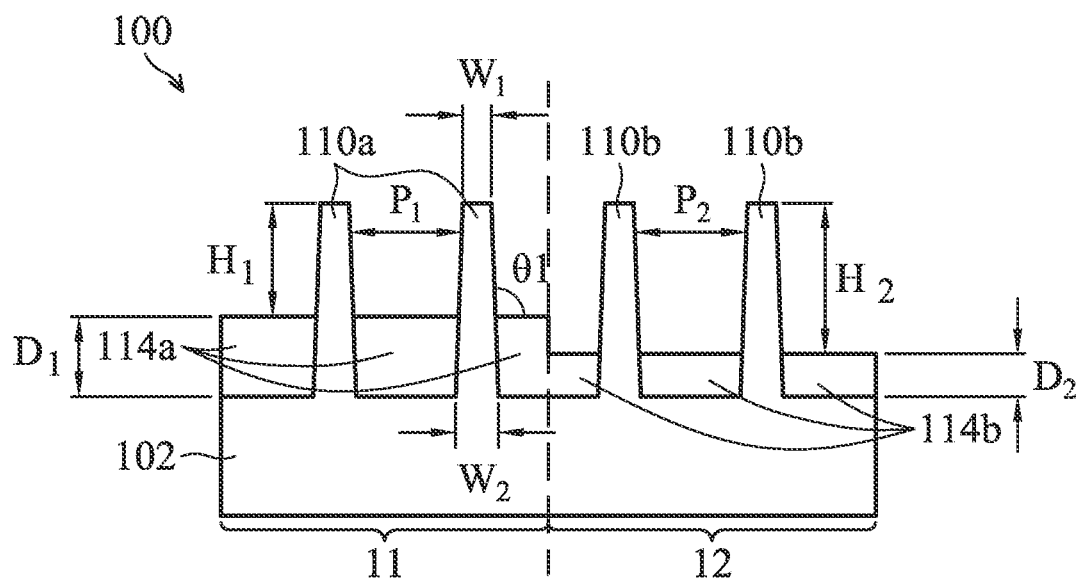

Next, as shown in FIGS. 1G and 2G, after the etching process 212, the mask layer 210 is removed, in accordance with some embodiments. As a result, a top surface of each of the first isolation structures 114a is higher than a top surface of each of the second isolation structures 114b. In other words, the top surface of each of the second isolation structures 114b is lower than the top surface of each of the first isolation structures 114a.

Each of the first fin structures 110a has a first fin height $H_1$ measured from a top surface of each of the first fin structures 110a to a top surface of each of the first isolation structures 114a. Each of the second fin structures 110b has a second fin height $H_2$ measured from a top surface of each of the second fin structures 110b to a top surface of each of the second isolation structures 110b. The first fin height $H_1$ is smaller than the second fin height $H_2$. In some embodiments, the first fin height $H_1$ is in a range from about 40 nm to about 60 nm. In some embodiments, the second fin height $H_2$ is in a range from about 40.1 nm to about 80 nm. The higher difference $\Delta H$ between the first fin height $H_1$ and the second fin height $H_2$ is in a range from about 0.1 nm to about 20 nm.

Each of the first isolation structures 114a has a first depth $D_1$, and each of the second isolation structures 114b has a second depth $D_2$. In some embodiments, the first depth $D_1$ of each of the first isolation structures 114a is greater than the second depth $D_2$ of each of the second isolation structures 114b.

In the first region 11, a first pitch $P_1$ is between two adjacent first fin structures 110a, and a second pitch $P_2$ is between two adjacent second fin structures 110b. In some embodiments, the first pitch $P_1$ is in a range from about 20 nm to about 60 nm. In some embodiments, the second pitch $P_2$ is in n a range from about 20 nm to about 60 nm.

As shown in FIG. 2G, a first angle θ1 between the sidewall surface of each of the fin structures 110a, 110b and the top surface of each of the isolation structures 114a, 114b. In some embodiments, the first angle θ1 is in a range from about 95 degrees to about 120 degrees. Each of the first structures 110a has a top width $W_1$ and a bottom width $W_2$, and the top width $W_1$ is smaller than the bottom width $W_2$.

Figure 1H:
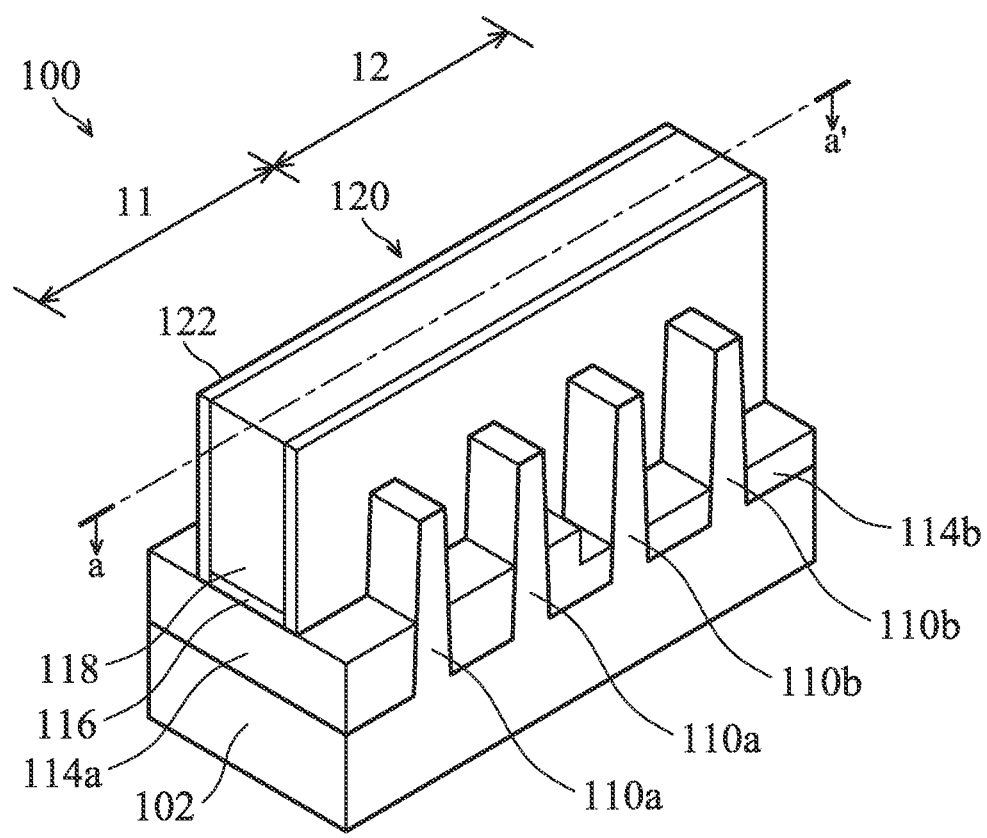
Figure 2H:
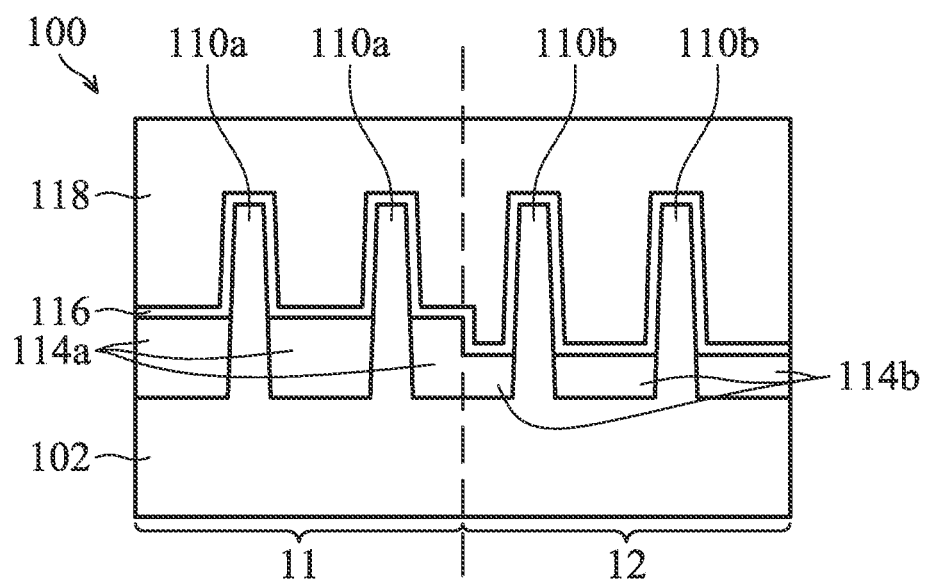

Afterwards, as shown in FIGS. 1H and 2H, a gate dielectric layer 116 is formed on the fin structures 110a, 110b, the isolation structures 114a, 114b, and a gate electrode layer 118 is formed on the gate dielectric layer 116, in accordance with some embodiments. A gate structure 120 is constructed by the gate dielectric layer 116 and the gate electrode layer 118. In some embodiments, the gate dielectric layer 116 is a dummy gate dielectric layer and the gate electrode layer 118 is a dummy gate electrode layer. The dummy gate dielectric layer and the dummy gate electrode layer may be replaced by the following steps to form a real gate structure with a high-k dielectric layer and a metal gate electrode layer.

In some embodiments, the gate dielectric layer 116 may include dielectric materials, such as silicon oxide, silicon nitride, silicon oxynitride, dielectric material(s) with high dielectric constant (high-k), or combinations thereof. In some embodiments, the gate electrode layer 118 is made of polysilicon. The gate dielectric layer 116 and the gate electrode layer 118 are independently formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, a pair of spacer layers 122 are formed on opposite sidewalls of the gate structure 120, in accordance with some embodiments. More specifically, the spacer layers 120 are formed on sidewall surfaces of the gate electrode layer 118. The spacer layers 122 may be made of silicon oxide, silicon nitride, silicon oxynitride, and/or dielectric materials. In some embodiments, the spacer layers 122 are formed by a chemical vapor deposition (CVD) process, a spin-on-glass process, or another applicable process.

Afterwards, a top portion of the fin structures 110a, 110b is removed to form a recess (not shown), and the source/drain (S/D) structures (not shown) are formed in the recess. The source/drain (S/D) structures are formed on opposite of the gate structure 120. In some embodiments, the S/D structures are strained source/drain structures. In some embodiments, the S/D structures are formed by growing a strained material in the recesses of the fin structures 110a, 110b by an epitaxial (epi) process. In addition, the lattice constant of the strained material may be different from the lattice constant of the substrate 102.

In some embodiments, the source/drain structures include Ge, SiGe, InAs, InGaAs, InSb, GaAs, GaSb, InAlP, InP, or a combination thereof. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, after the S/D structures are formed, a contact etch stop layer (CESL) (not shown) is formed on the S/D structures and the gate structure 120. In some embodiments, the contact etch stop layer is made of silicon nitride, silicon oxynitride, and/or other applicable materials. The contact etch stop layer may be formed by plasma enhanced CVD, low pressure CVD, ALD, or other applicable processes.

Figure 1I:
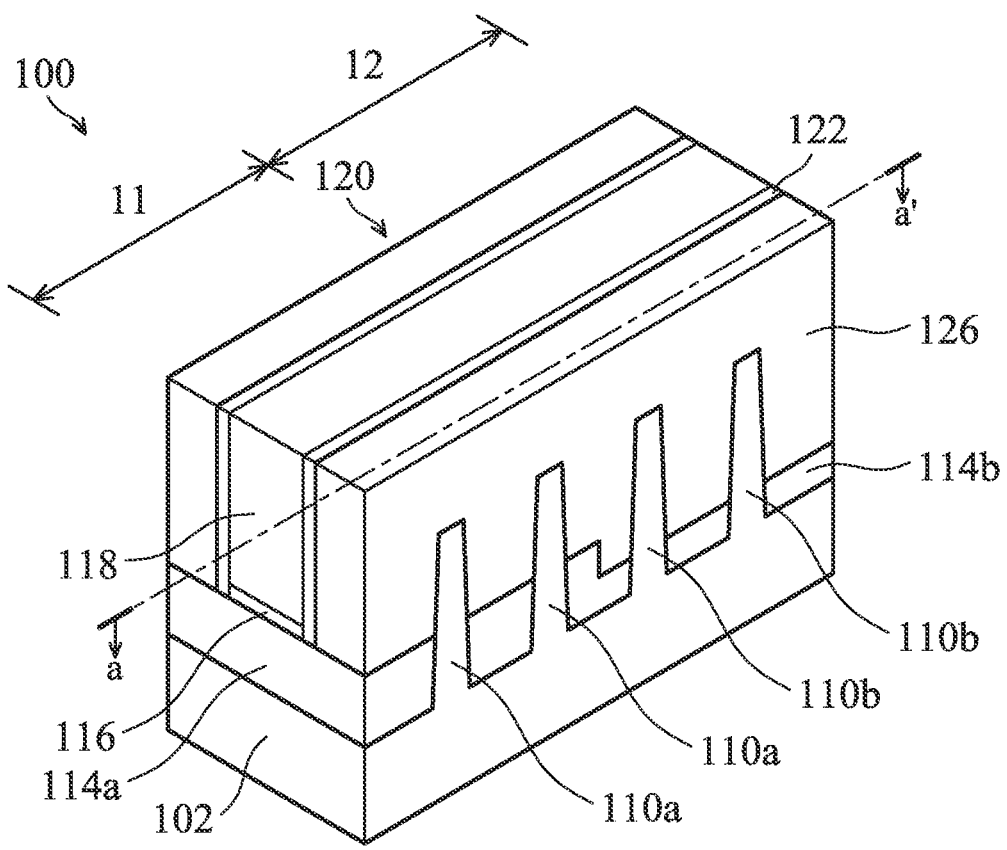
Figure 2I:
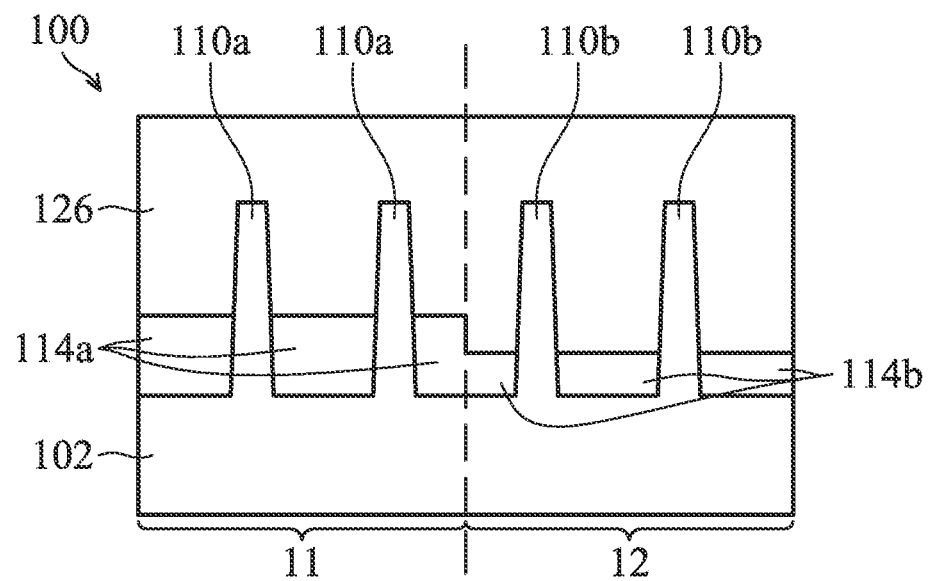

Afterwards, as shown in FIGS. 1I and 2I, an inter-layer dielectric (ILD) material is formed over the fin structures 110a, 110b over the substrate 102, in accordance with some embodiments. Next, the ILD material is planarized to form the ILD structure 126.

The ILD structure 126 has a first portion in the first region 11 and a second portion in the second region 12. A bottom surface of the first portion of the ILD structure 126 is higher than a bottom surface of the second portion of the ILD structure 126. The ILD structure 126 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 126 may be formed by chemical vapor deposition (CVD), physical vapor deposition, (PVD), atomic layer deposition (ALD), spin-on coating, or other applicable processes.

Afterwards, the dummy gate dielectric layer 116 and the dummy gate electrode layer 118 are removed to form a trench, and the real gate dielectric layer and metal gate electrode layer (not shown) are filled into the trench. In some embodiments, a work function layer (not shown) may be formed between the gate dielectric layer and the gate electrode layer. The work function layer (not shown) is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Afterwards, the FinFET device structure 200 continues to form other devices or structures.

In the first embodiment, the FinFET device structure 100 with different fin heights is obtained by performing two etching processes. The first etching process is performed to simultaneously remove a portion of the first isolation structures 110a and a portion of the second isolation structures 110b. The second etching process with an extra mask layer is used to further remove the second isolation structures 110b to a predetermined depth. Compared with forming the second isolation structure by using one etching process, the etching amount is controlled more precisely by the two etching process. Especially when the FinFET device structure has a fine spacing (or smaller pitch), which is in the range of nanometers (nm), between neighboring gate structures, removal of the bottom portion of the second isolation structures 114b becomes difficult due to the shadow effect. In order to control the fin height more precisely, the second isolation structures 114b are etched by a first rough etching process and a second accurate etching process. In addition, the second etching process is compatible with the FinFET processes.

Furthermore, the FinFET device structure 100 with different fin heights can improve the cutoff frequency (Ft), and therefore the FinFET device structure 100 can be used in the high-frequency device.

FIGS. 3A-3H show perspective representations of various stages of forming a FinFET device structure 200, in accordance with some embodiments of the disclosure. FIGS. 4A-4H show cross-sectional representations of various stages of forming the FinFET device structure 200 shown in FIGS. 3A-3H. FIGS. 4A-4H show cross-sectional representations taken along line aa' in FIGS. 3A-3H. Some processes and materials used to form the FinFET device structure 200 are similar to, or the same as, those used to form the FinFET structure 100 and are not repeated herein.

Figure 3A:
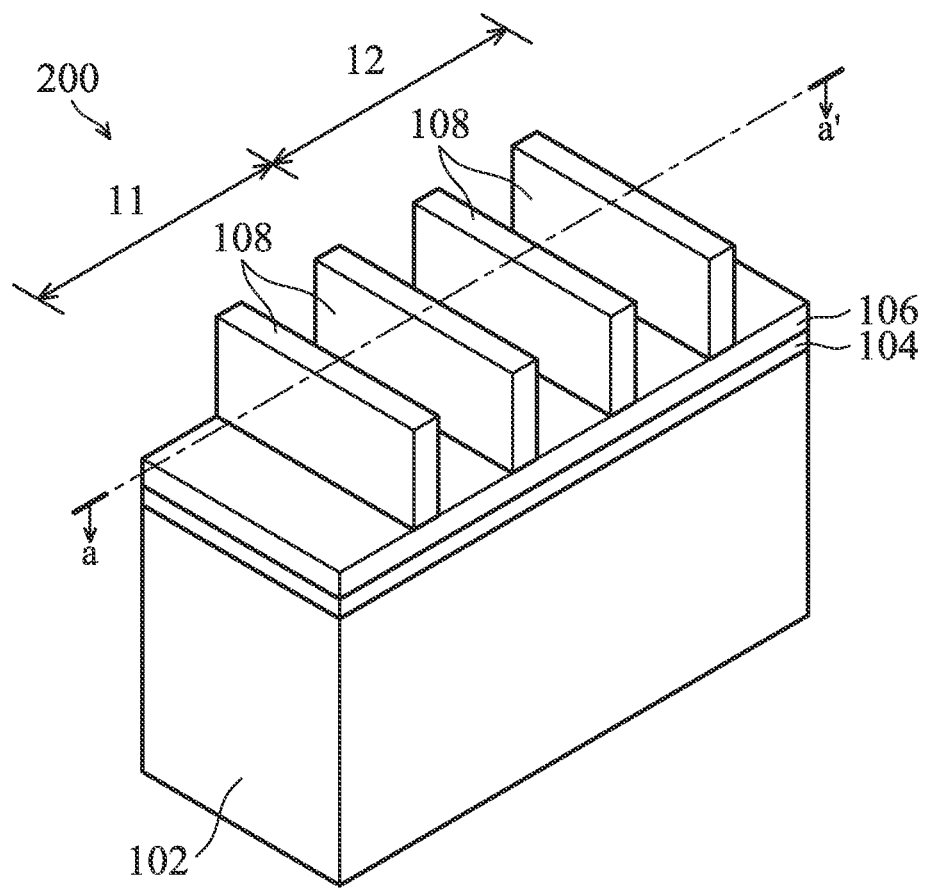
FIGS. 3A-3H show perspective representations of various stages of forming a FinFET device structure, in accordance with some embodiments of the disclosure.
Figure 4A:
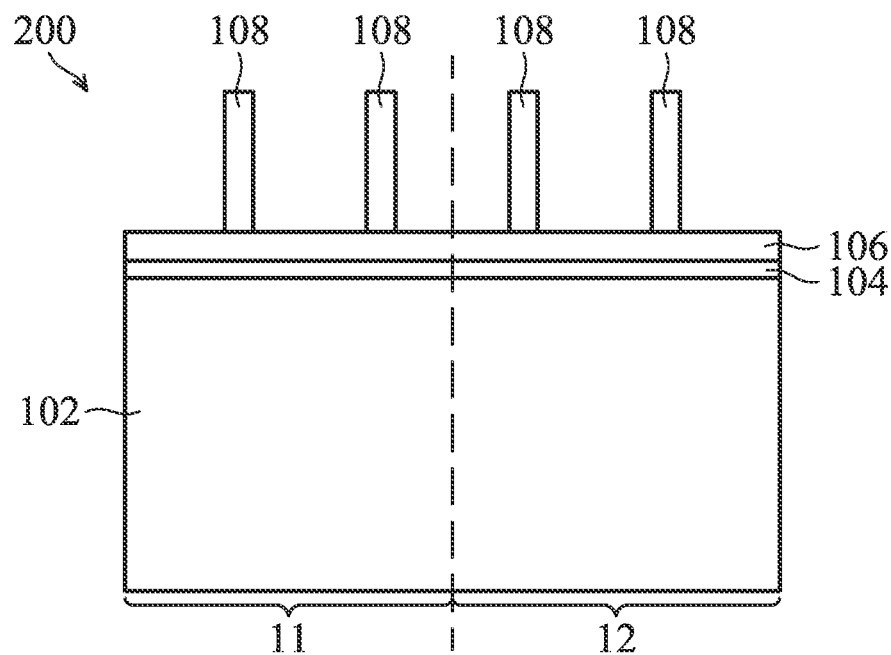
FIGS. 4A-4H show cross-sectional representations of various stages of forming the FinFET device structure shown in FIGS. 3A-3H.
Figure 3B:
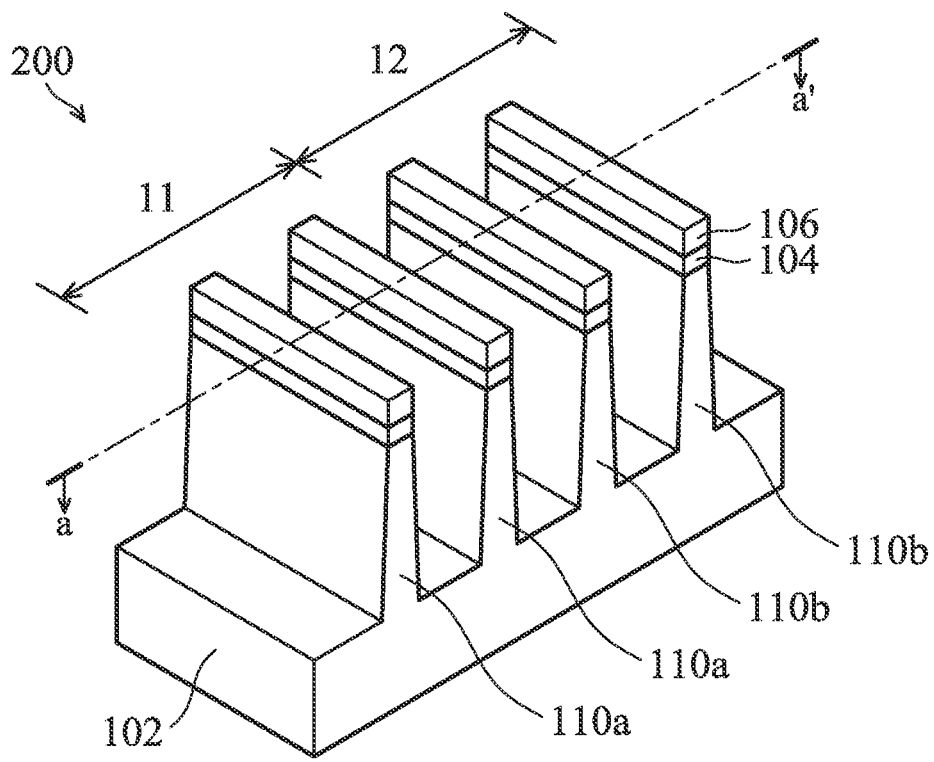
Figure 4B:
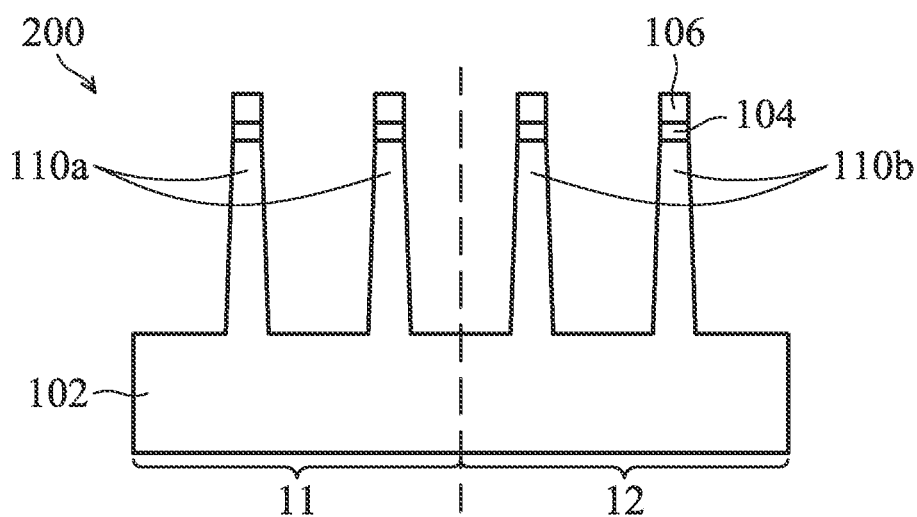

The structures in FIGS. 3A-3B are similar to the structures in FIGS. 1A-1B and the structures in FIGS. 4A-4B are similar to the structures in FIGS. 2A-2B, and are not repeated herein.

Figure 3C:
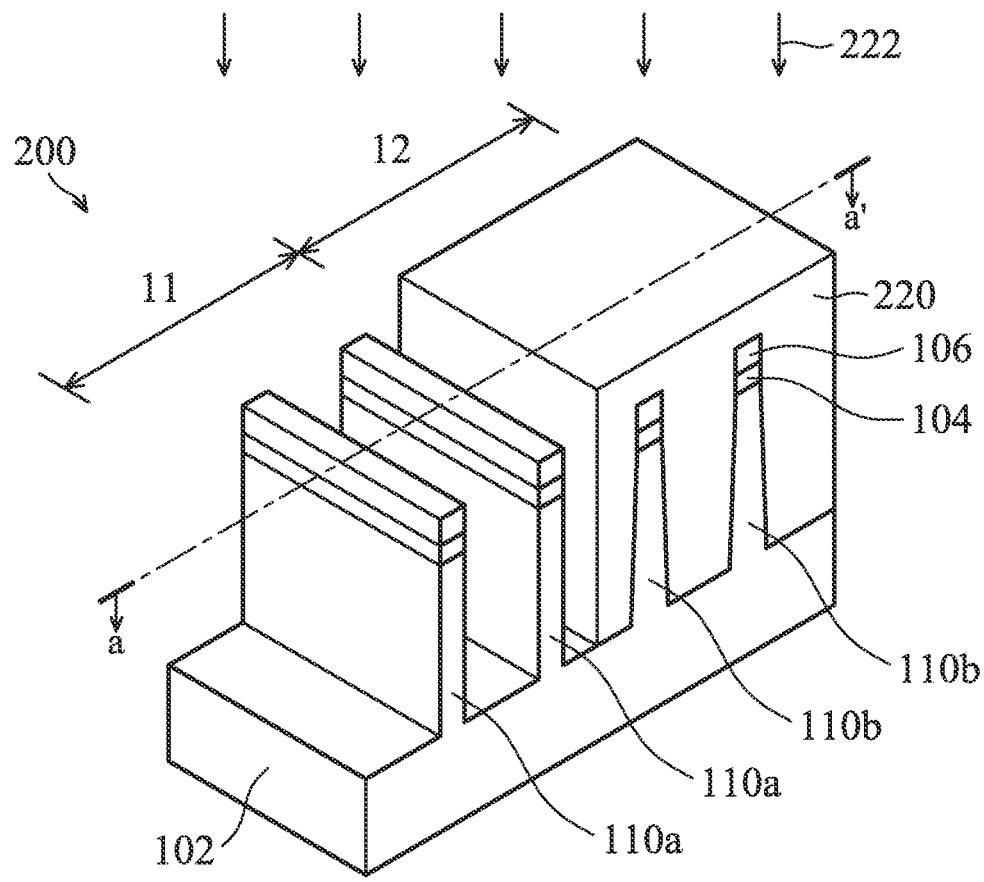
Figure 4C:
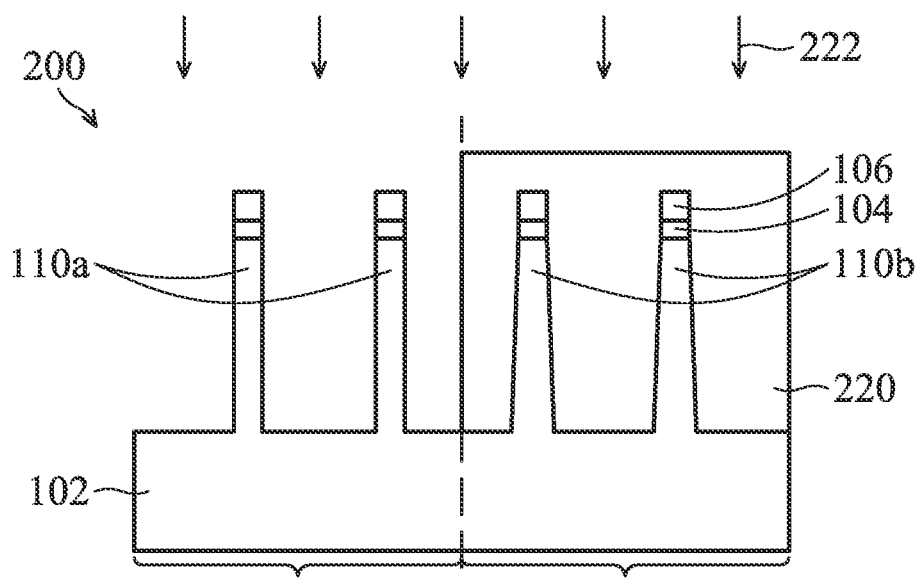

Afterwards, as shown in FIGS. 3C and 4C, a mask layer 220 is formed over the second fin structures 110b in the second region 12, and a portion of the first fin structures 110 is removed, in accordance with some embodiments. An etching process 222 is performed on the first fin structures 110 over the first region 11 to remove or shape a portion of the first fin structures 110a. In some embodiments, the etching process 222 is a dry etching process with etching gas, such as $Cl_2$, HB, $CF_4$ or another applicable gas. Each of the first fin structures 110a has a constant width from a bottom portion to a top portion.

Figure 3D:
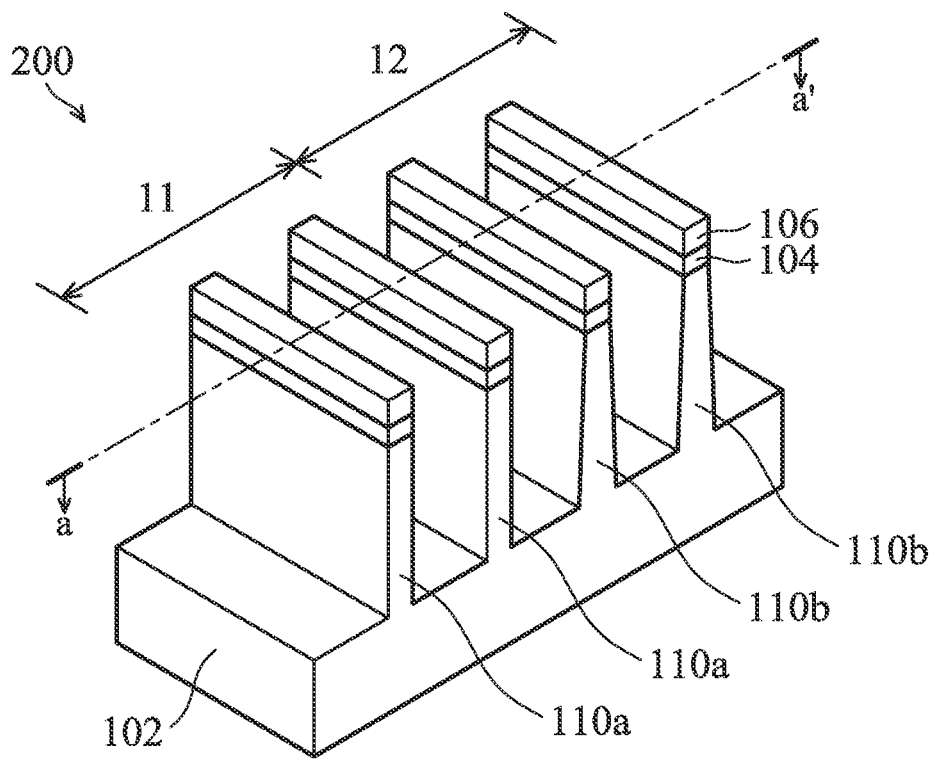
Figure 4D:
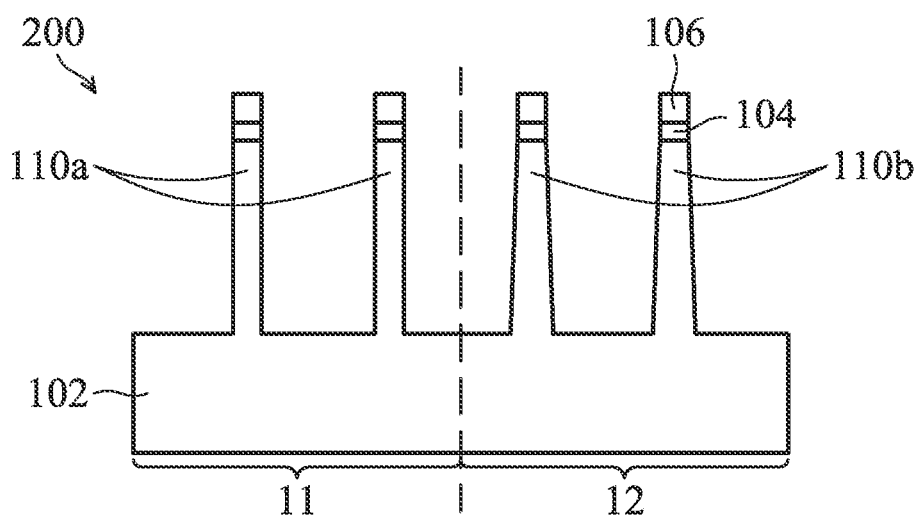

Next, as shown in FIGS. 3D and 4D, after the etching process 222, the mask layer 220 is removed, in accordance with some embodiments. The mask layer 220 may be removed by a dry etching process or a wet etching process.

The first fin structures 110a in the first region 11 and the second fin structures 110b in the second region 12 have different fin profiles. The first fin structures 110a are etching twice and have straighter sidewall surface when compared with the second fin structures 110b.

Figure 3E:
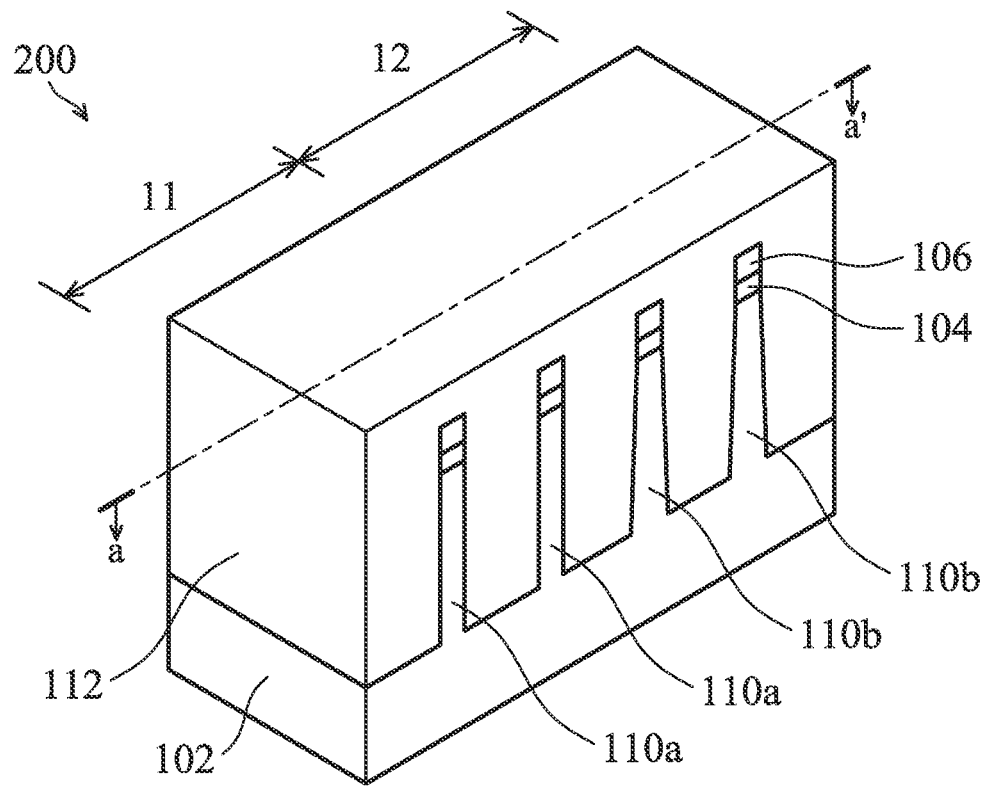
Figure 4E:
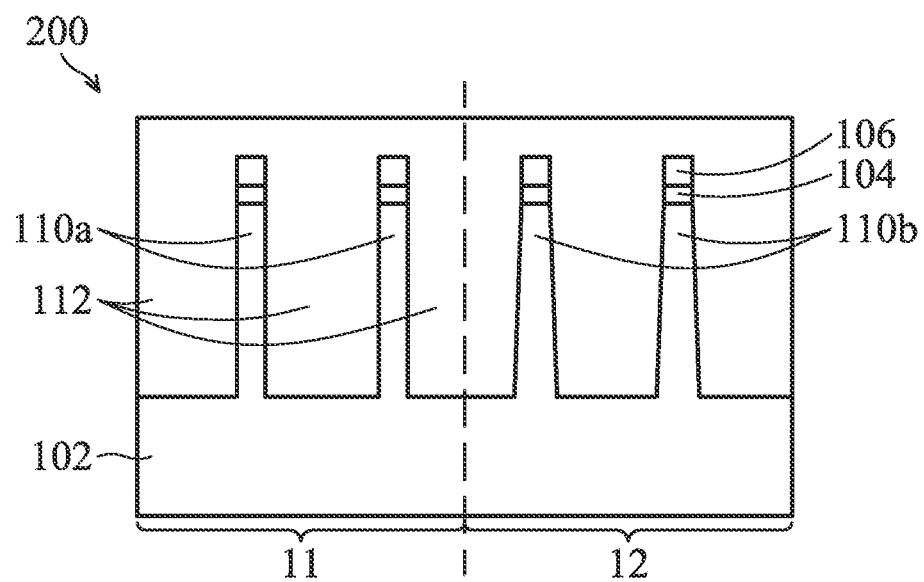

Afterwards, as shown in FIGS. 3E and 4E, the isolation layer 112 is formed to cover the fin structures 110a, 110b over the substrate 102, in accordance with some embodiments.

Figure 3F:
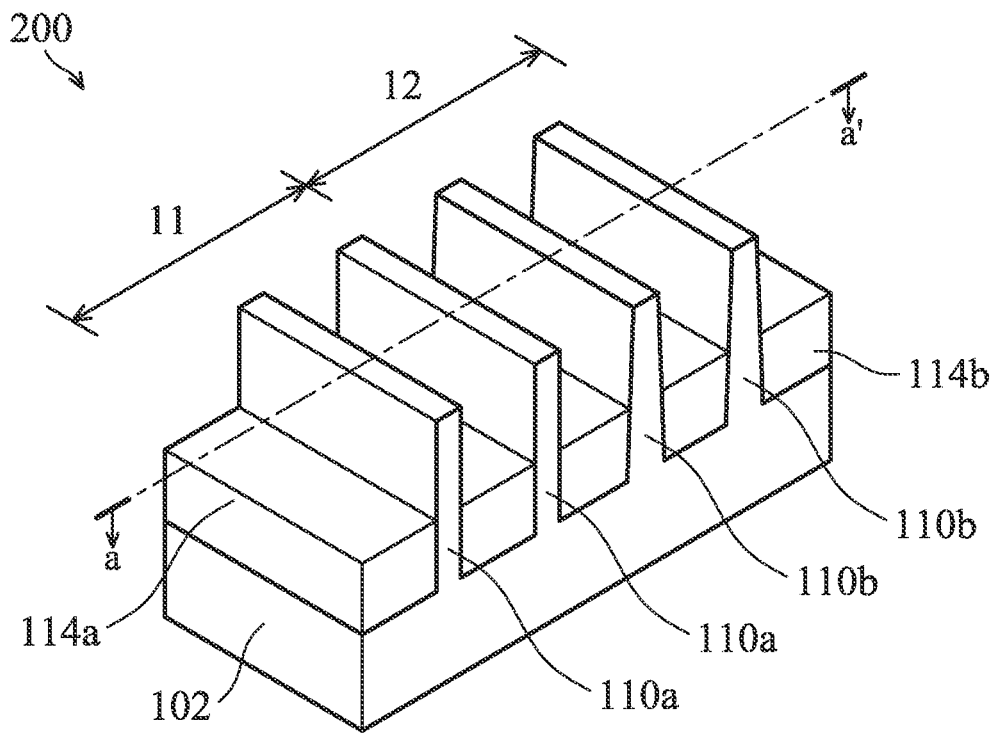
Figure 4F:
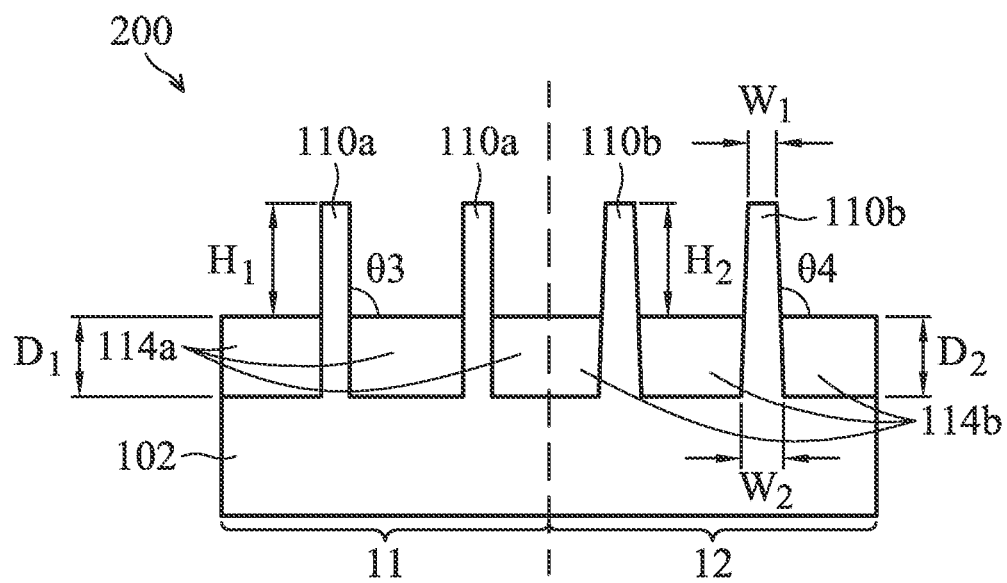

Afterwards, as shown in FIGS. 3F and 4F, the isolation layer 112 is thinned or planarized, and then is etched to form the first isolation structures 114a and the second isolation structures 114b, in accordance with some embodiments. As a result, the first fin structures 110a are surrounded by the first isolation structures 114a, and the second fin structures 110b are surrounded by the second isolation structures 114b.

Each of the first fin structures 110a has a first fin height $H_1$ and each of the second fin structures 110b has a second fin height $H_2$. In some embodiments, the first fin height $H_1$ is equal to the second fin height $H_2$. Each of the second structures 110b has a top width $W_1$ and a bottom width $W_2$, and the top width $W_1$ is smaller than the bottom width $W_2$. Each of the first fin structures 110a has a constant width from a bottom portion to a top portion.

A third angle $\theta_3$ is between the sidewall surface of each of the first fin structures 110a and the top surface of the first isolation structures 114a. The sidewall surface of each of the first fin structures 110 is substantially orthogonal to the top surface of each of the first isolation structures 114a. A fourth angle $\theta_4$ is between the sidewall surface of each of the second fin structures 110b and the top surface of the second isolation structures 114b. In some embodiments, the third angle $\theta_3$ is smaller than the fourth angle $\theta_4$. In some embodiments, the third angle $\theta_3$ is in a range from about 80 degrees to about 90 degrees. In some embodiments, the fourth angle $\theta_4$ is in a range from about 80 degrees to about 120 degrees. The angle difference between the third angle $\theta_3$ and the fourth angle $\theta_4$ is in a range from about 0 degree to about 30 degrees.

Figure 3G:
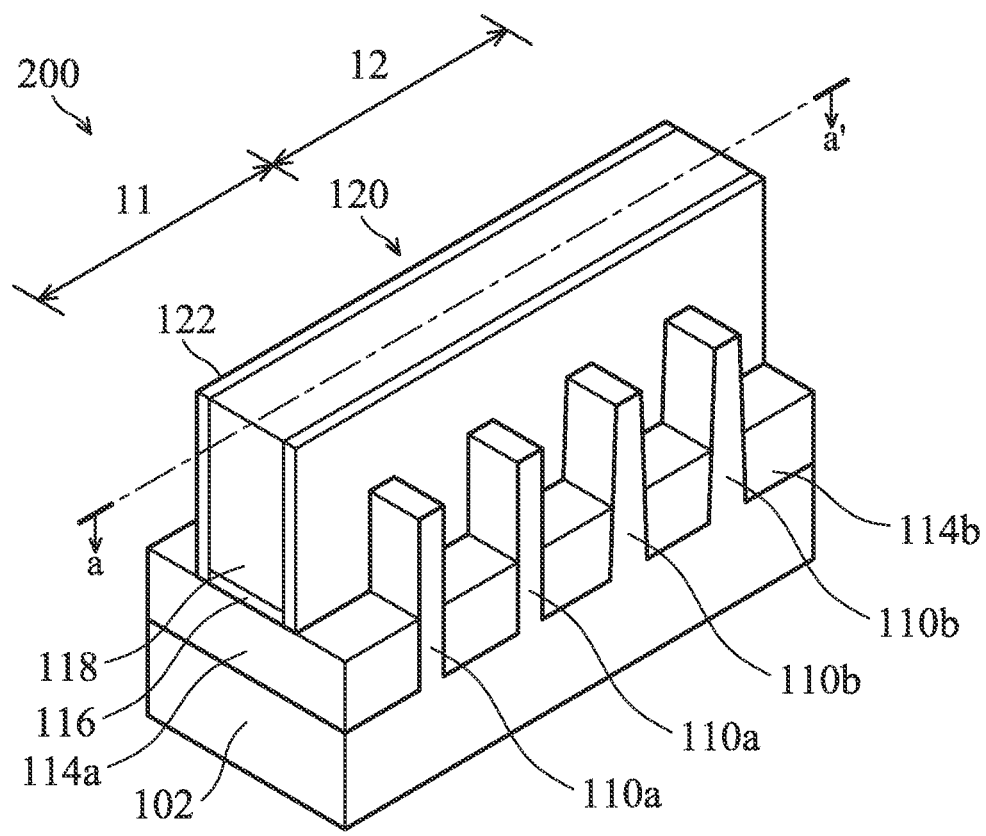
Figure 4G:
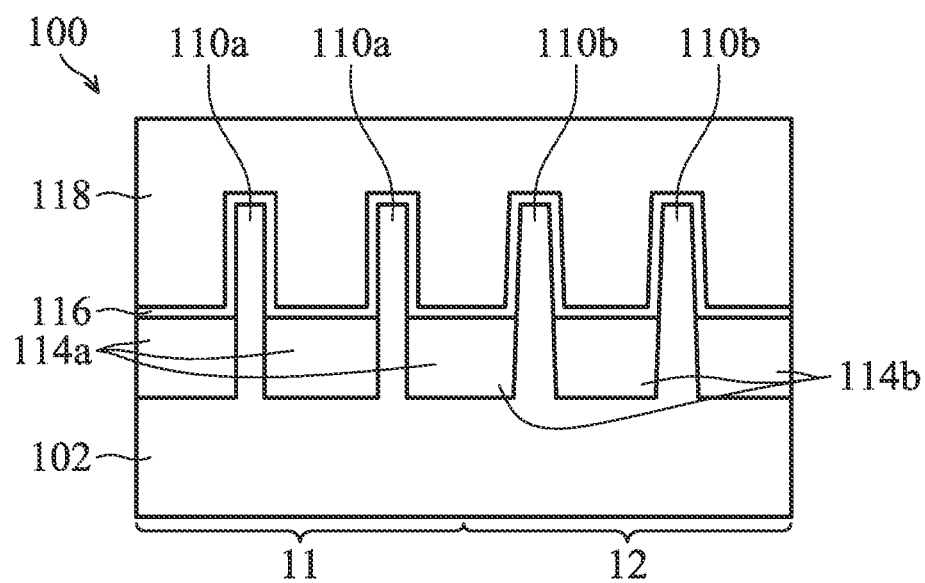

Next, as shown in FIGS. 3G and 4G, the gate structure 120 is formed on the fin structures 110a, 110b, the isolation structures 114a, 114b, in accordance with some embodiments. The gate structure 120 includes the gate dielectric layer 116 and the gate electrode layer 118. Afterwards, a pair of spacer layers 122 are formed on opposite sidewalls of the gate structure 120.

Figure 3H:
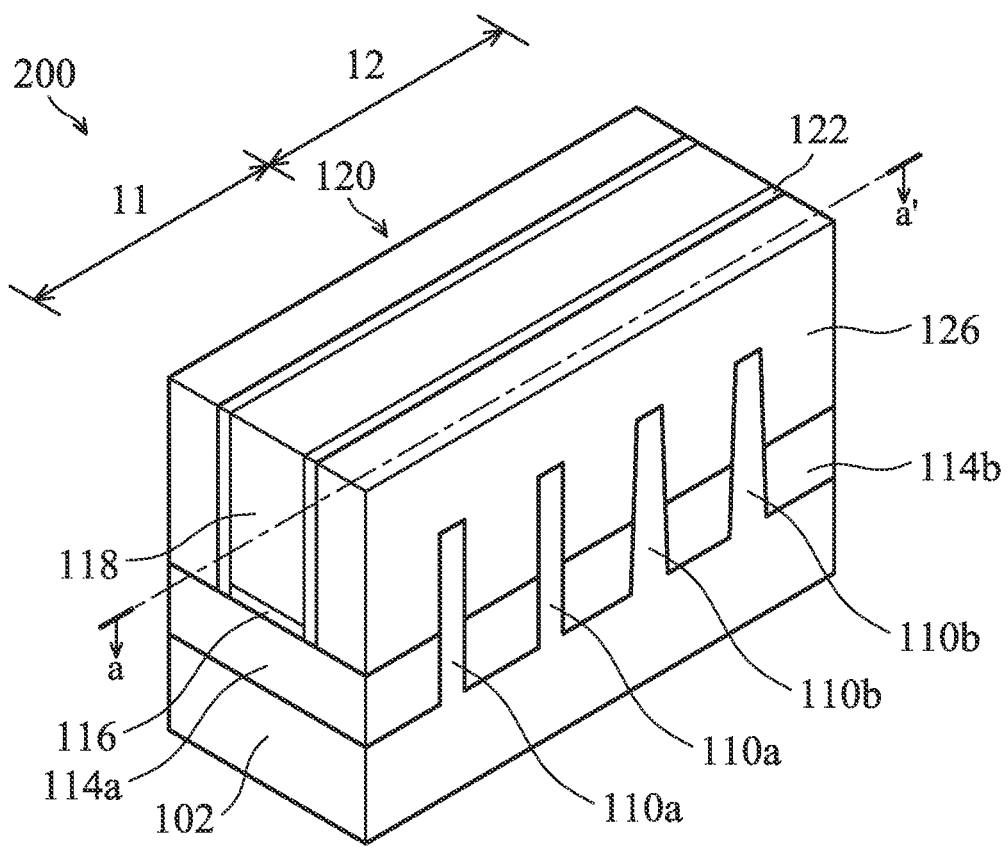
Figure 4H:
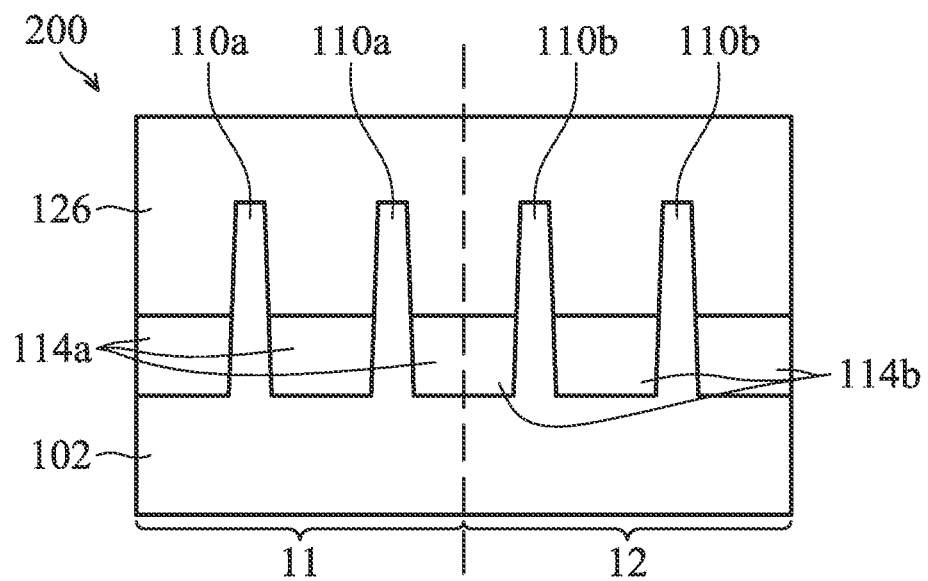

Afterwards, as shown in FIGS. 3H and 4H, the ILD structure 126 is formed on the fin structures 110a, 110b and the isolation structures 114a, 114b, in accordance with some embodiments. Afterwards, the FinFET device structure 200 continues to form other devices or structures.

In the second embodiment, the FinFET device structure 200 is formed to have different fin profiles. The first fin structures 110a in the first region 11 have straighter sidewall surfaces, and the second fin structures 110b in the second region 12 have sloped sidewall surfaces. By forming different fin profiles, the parasite capacitance (C) of the FinFET device structures 200 is reduced, and therefore the cutoff frequency (Ft) of FinFET device structure 200 is improved. Therefore, the FinFET device structure 200 can be used in the high-frequency device.

FIGS. 5A-5E show perspective representations of various stages of forming a FinFET device structure 300, in accordance with some embodiments of the disclosure. FIGS. 6A-6E show cross-sectional representations of various stages of forming the FinFET device structure 300 shown in FIGS. 5A-5E. FIGS. 6A-6E show cross-sectional representations taken along line aa' in FIGS. 5A-5E. Some processes and materials used to form the FinFET device structure 300 are similar to, or the same as, those used to form the FinFET structure 100 and are not repeated herein.

Figure 5A:
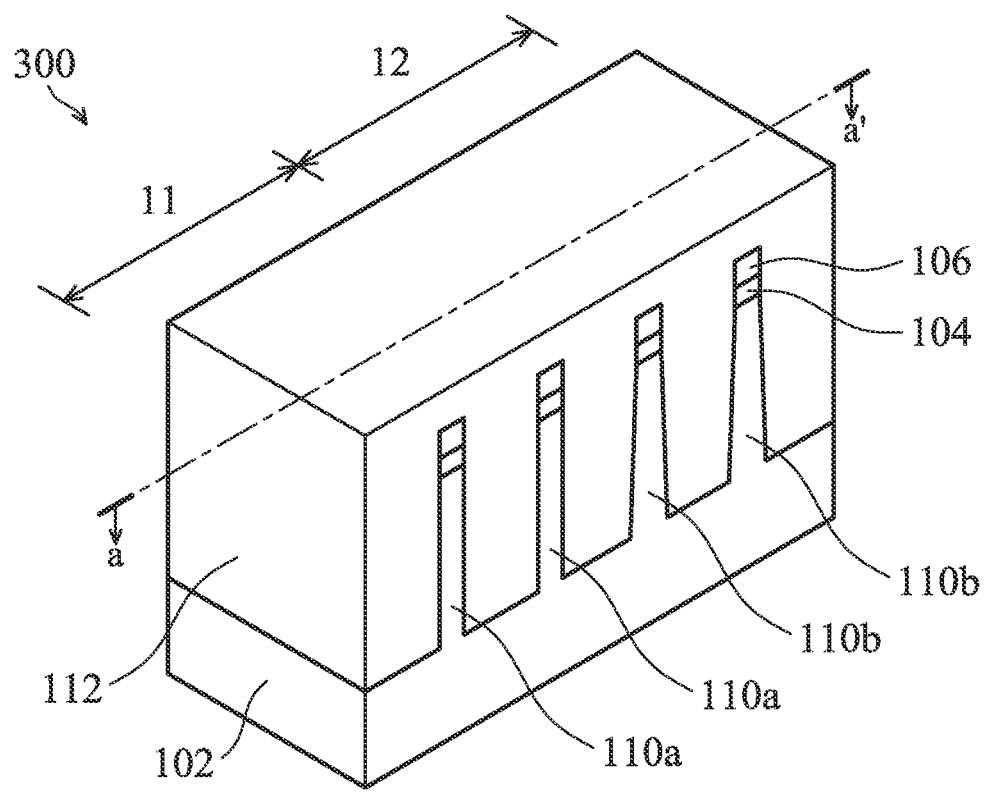
FIGS. 5A-5E show perspective representations of various stages of forming a FinFET device structure, in accordance with some embodiments of the disclosure.
Figure 6A:
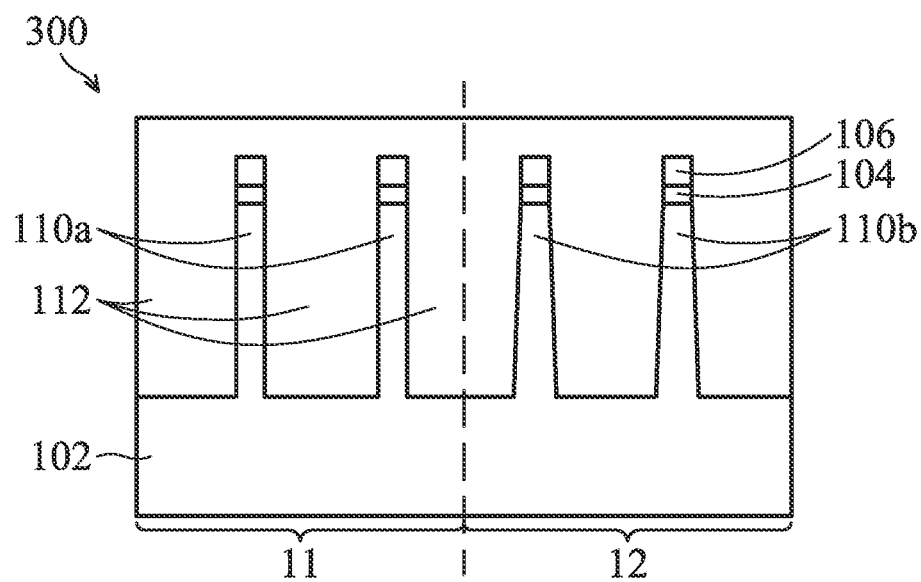
FIGS. 6A-6E show cross-sectional representations of various stages of forming the FinFET device structure shown in FIGS. 5A-5E.

As shown in FIGS. 5A and 6A, after the fin structures 110a, 110b are formed, the isolation layer 112 is formed to cover the fin structures 110a, 110b over the substrate 102, in accordance with some embodiments.

Figure 5B:
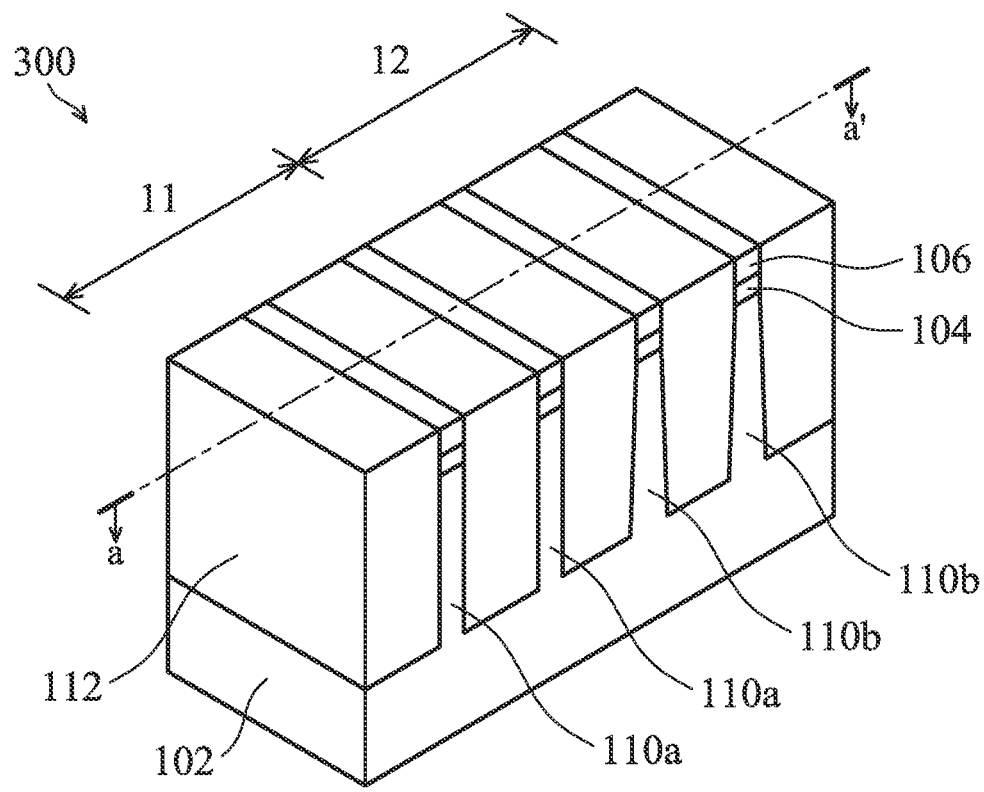
Figure 6B:
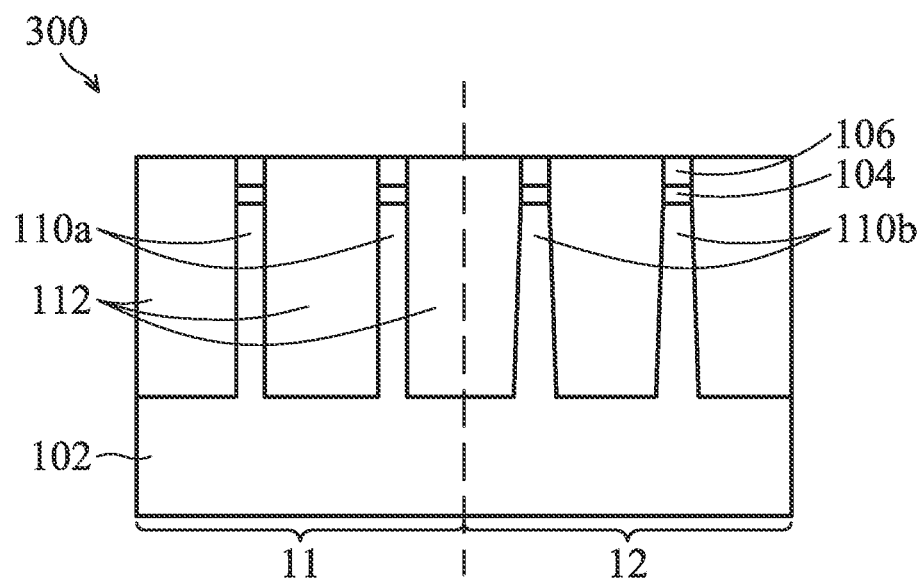

Afterwards, as shown in FIGS. 5B and 6B, the isolation layer 112 is thinned or planarized to expose the top surface of the patterned mask layer 106. In some embodiments, the insulating layer 112 is thinned by a chemical mechanical polishing (CMP) process.

Figure 5C:
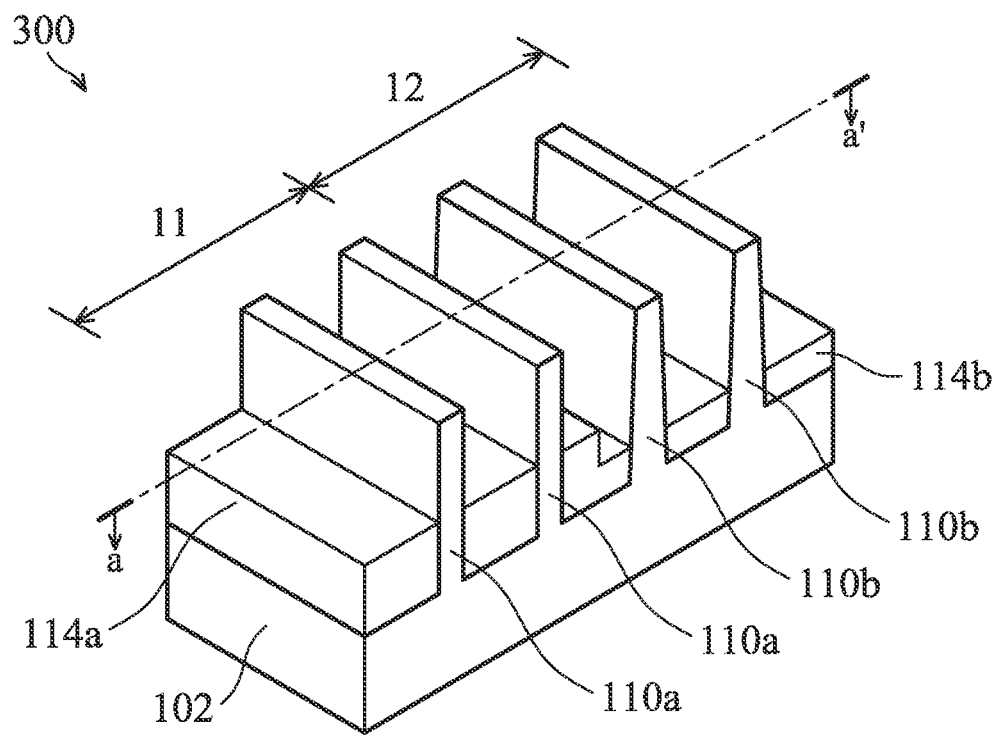
Figure 6C:
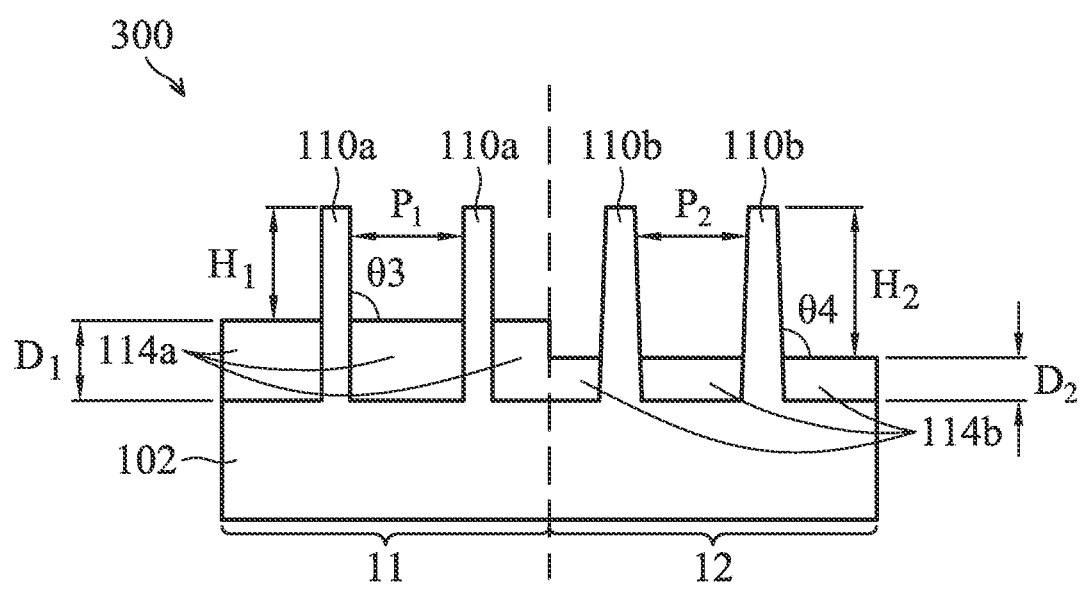

Afterwards, as shown in FIGS. 5C and 6C, a portion of the insulating layer 112 is removed to form a number of isolation structures 114, in accordance with some embodiments. In addition, the patterned dielectric layer 104 and the patterned mask layer 106 are removed. The isolation structures 114 include first isolation structures 114a over the first region 11 and second isolation structures 114b over the second region 12.

It should be noted that the second pitch $P_2$ between two adjacent second fin structures 110*b* is greater than the first pitch $P_1$ between two adjacent first fin structures 110*a* due to the second fin structures 110*b* with a narrower top portion. More of the second isolation structures 114*b* are removed compared with the first isolation structures 114*a* since the etching gas may easily pass through the wider opening (or wider pitch $P_2$). The first isolation structures 114*a* are removed less, such that the top surface of each of the first isolation structures 114*a* is higher than the top surface of each of the second isolation structures 114*b*.

The first fin height $H_1$ of each of the first fin structures 110*a* is smaller than the second fin height $H_2$ of each of the second fin structures 110*b*. The first depth $D_1$ of each of the first isolation structures 114*a* is greater than the second depth $D_2$ of each of the second isolation structures 114*b*. In addition, the third angle $\theta_3$ is smaller than the fourth angle $\theta_4$.

Figure 5D:
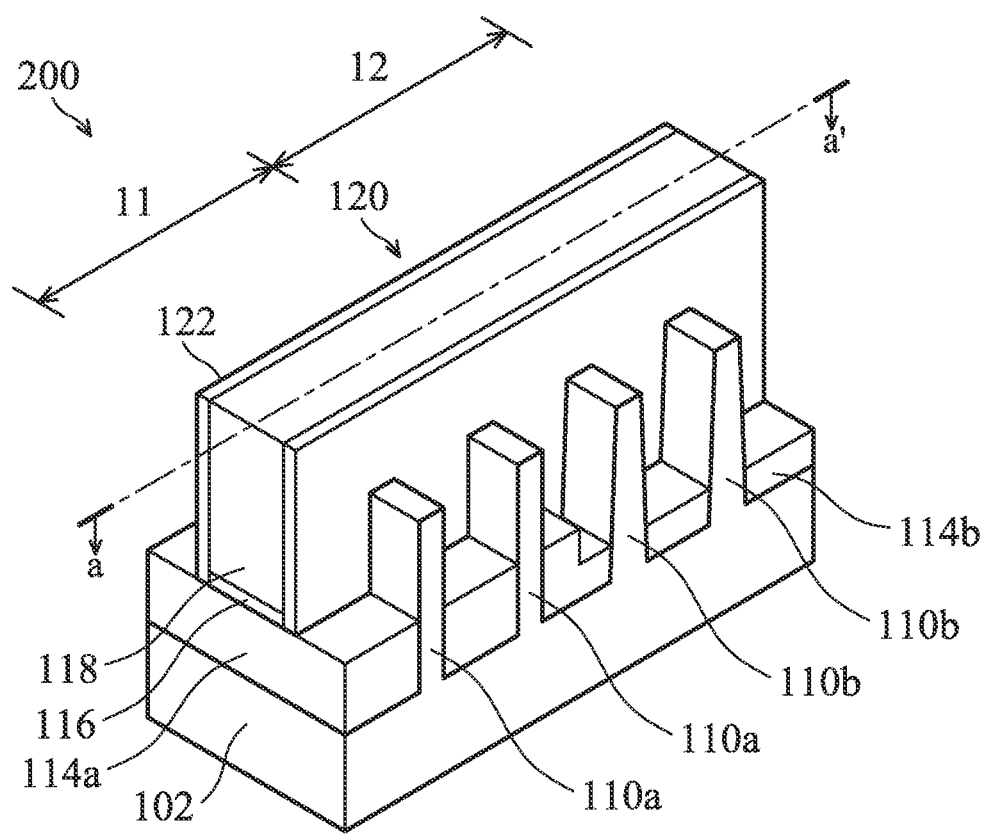
Figure 6D:
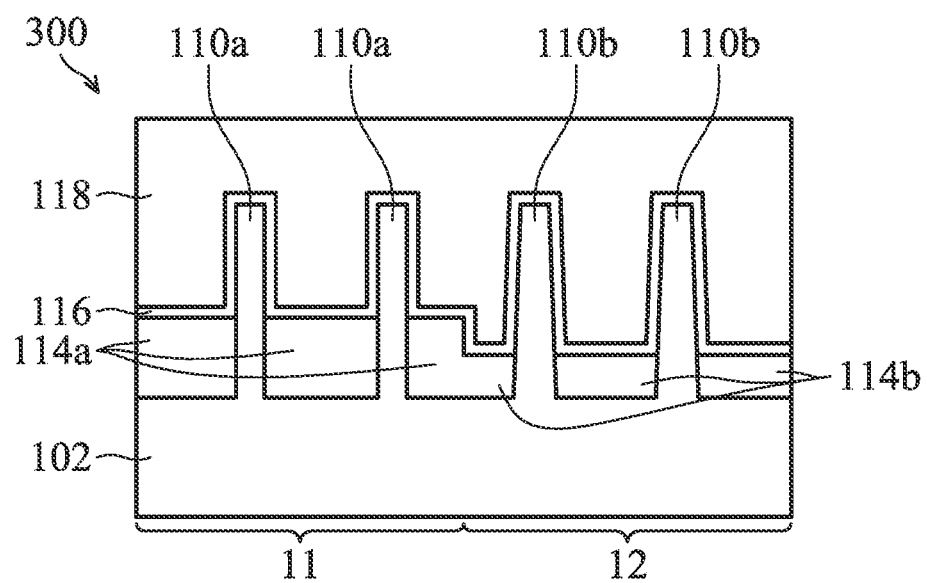

Afterwards, as shown in FIGS. 5D and 6D, the gate structure 120 is formed on the fin structures 110*a*, 110*b*, the isolation structures 114*a*, 114*b*, in accordance with some embodiments. The gate structure 120 includes the gate dielectric layer 116 and the gate electrode layer 118. Afterwards, a pair of spacer layers 122 are formed on opposite sidewalls of the gate structure 120.

Figure 5E:
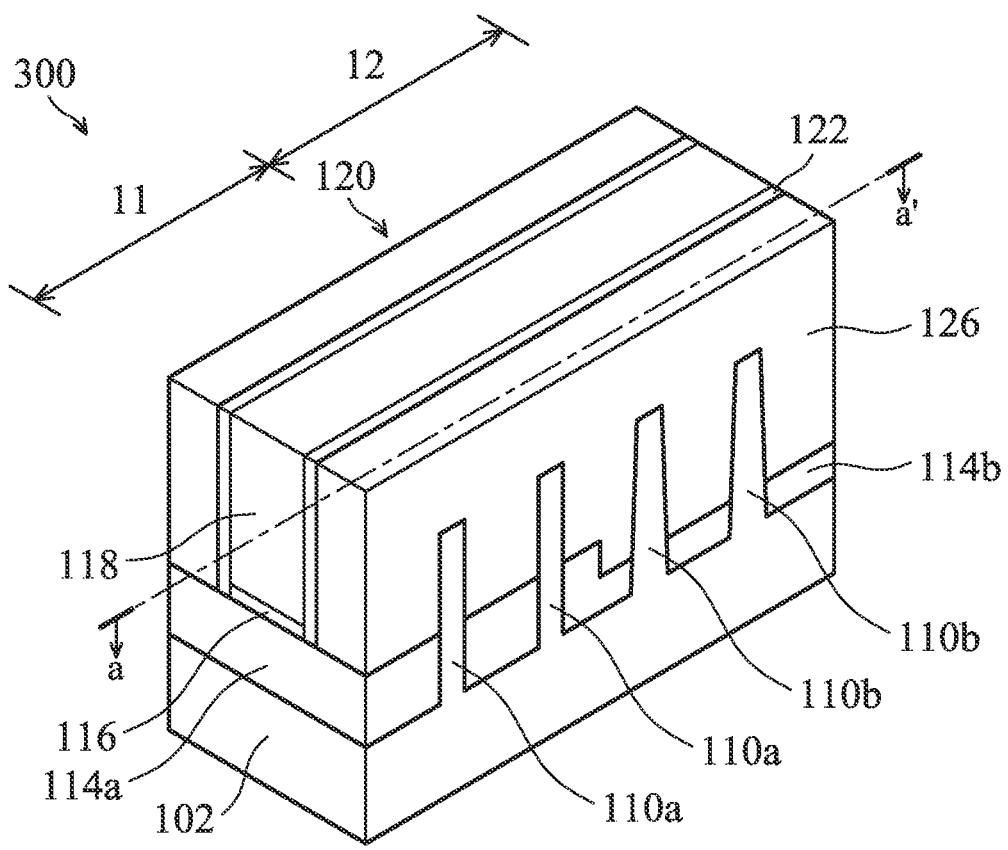
Figure 6E:
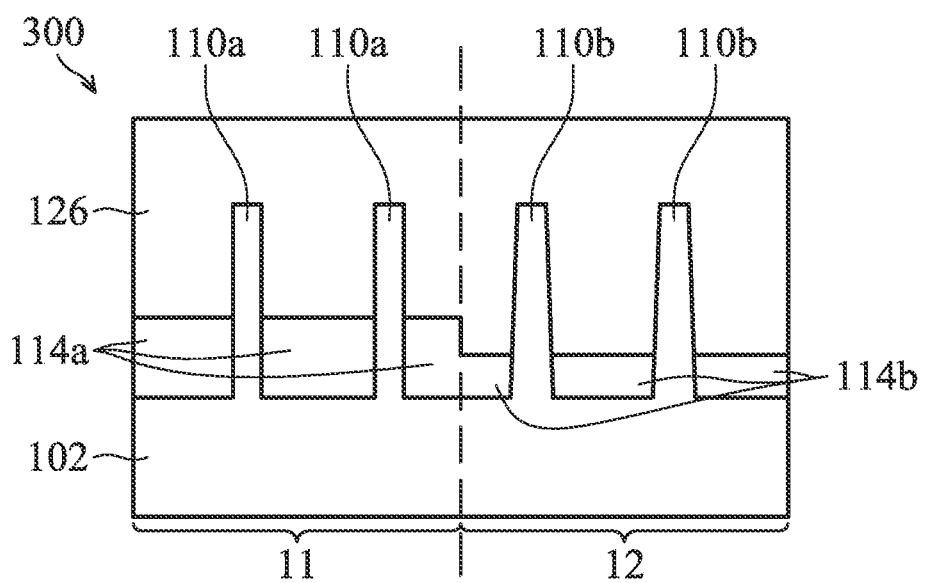

Next, as shown in FIGS. 5E and 6E, the ILD structure 126 is formed on the fin structures 110*a*, 110*b* and the isolation structures 114*a*, 114*b*, in accordance with some embodiments. The ILD structure 126 has a first portion in the first region 11 and a second portion in the second region 12. A bottom surface of the first portion of the ILD structure 126 is higher than a bottom surface of the second portion of the ILD structure 126. Afterwards, the FinFET device structure 300 continues to form other devices or structures.

In the third embodiment, the FinFET device structure 300 is formed to have different fin profiles and different fin heights. The first fin structures 110*a* in the first region 11 have straighter sidewall surfaces and lower first fin height $H_1$ and the second fin structures 110*b* in the second region 12 have sloped sidewall surfaces and higher second fin height $H_2$. By forming different fin profiles and fin heights, the cutoff frequency (Ft) of FinFET device structure 300 is improved. Therefore, the FinFET device structure 300 can be used in the high-frequency device.

FIGS. 7A-7D show perspective representations of various stages of forming a FinFET device structure 400, in accordance with some embodiments of the disclosure. FIGS. 8A-8D show cross-sectional representations of various stages of forming the FinFET device structure 400 shown in FIGS. 7A-7D. FIGS. 8A-8D show cross-sectional representations taken along line aa' in FIGS. 7A-7D. Some processes and materials used to form the FinFET device structure 400 are similar to, or the same as, those used to form the FinFET structure 100 and are not repeated herein.

Figure 7A:
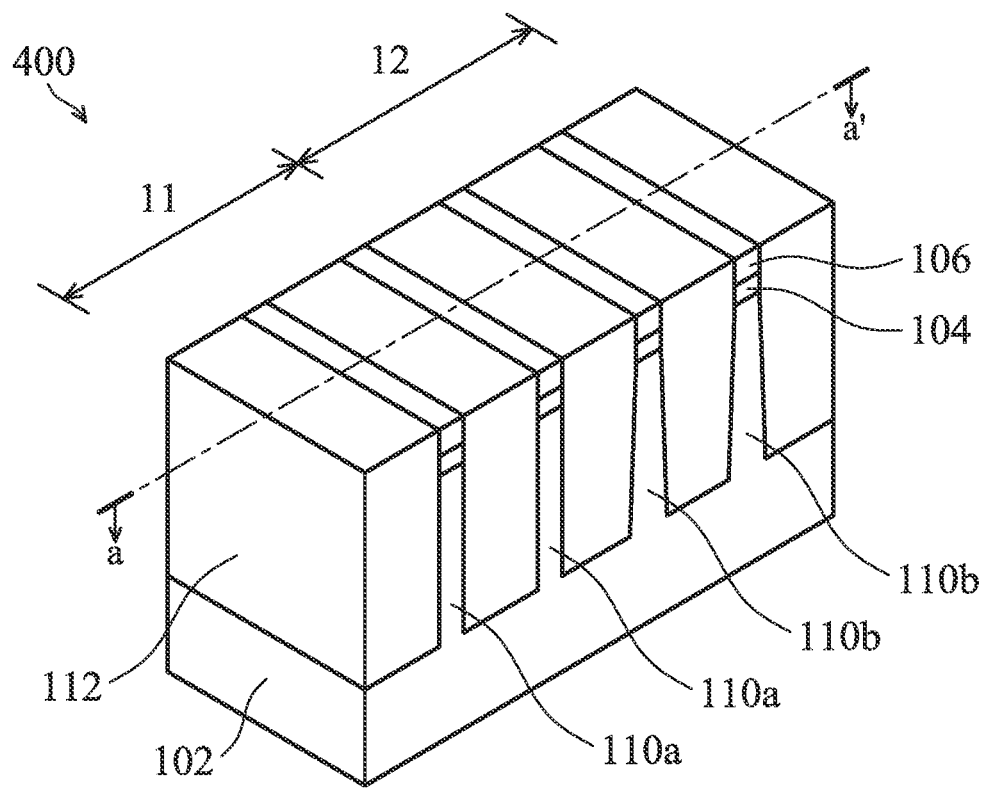
FIGS. 7A-7D show perspective representations of various stages of forming a FinFET device structure, in accordance with some embodiments of the disclosure.
Figure 8A:
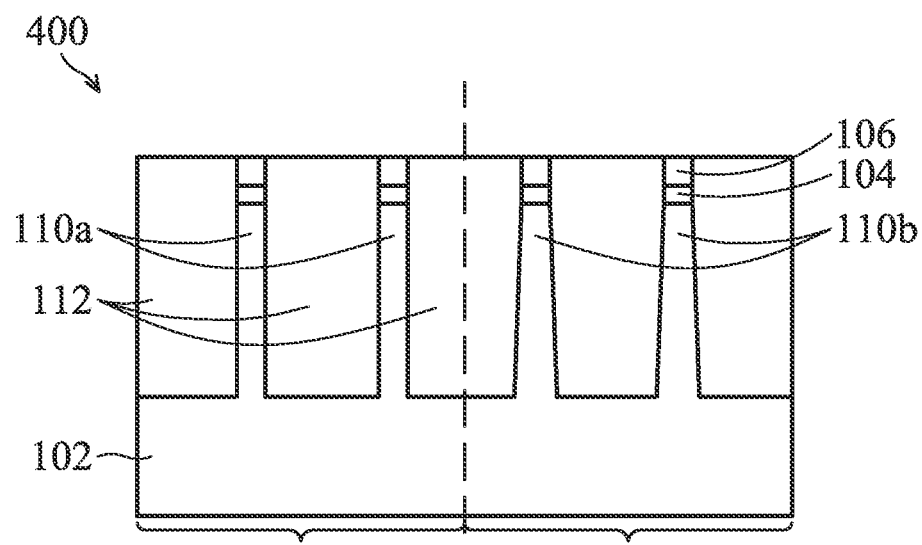
FIGS. 8A-8D show cross-sectional representations of various stages of forming the FinFET device structure shown in FIGS. 7A-7D.

As shown in FIGS. 7A and 8A, each of the first fin structures 110*a* in the first region 11 has constant fin width, and each of the second fin structures 110*b* in the second region 12 has a tapered width which is gradually tapered from the bottom portion to the top portion. The isolation layer 112 over the fin structures 110*a*, 110*b* and then is thinned or planarized to expose the top surface of the patterned mask layer 106. In some embodiments, the insulating layer 112 is thinned by a chemical mechanical polishing (CMP) process.

Figure 7B:
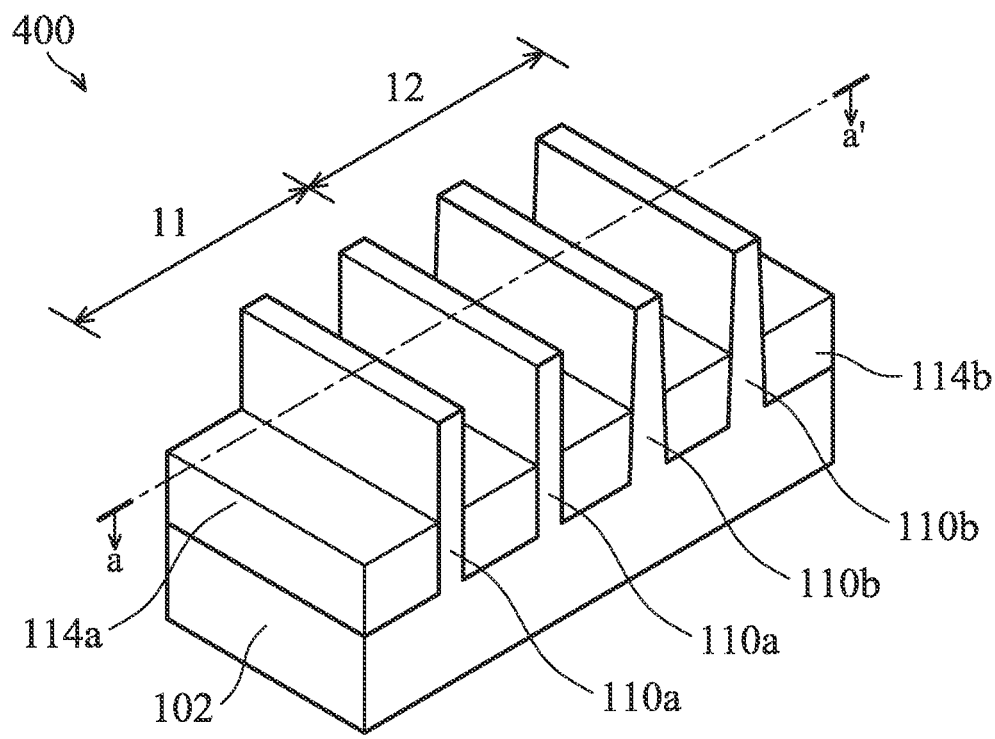
Figure 8B:
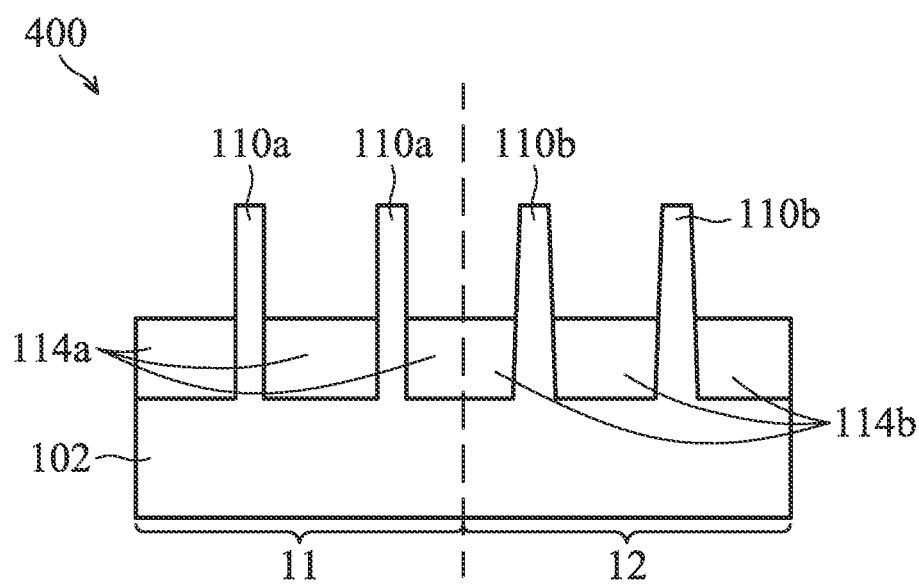

Next, as shown in FIGS. 7B and 8B, a portion of the insulating layer 112 is removed to form a number of isolation structures 114, in accordance with some embodiments.

In addition, the patterned dielectric layer 104 and the patterned mask layer 106 are removed. The first isolation structures 114*a* over the first region 11 and the second isolation structures 114*b* over the second region 12 both have the same height.

Figure 7C:
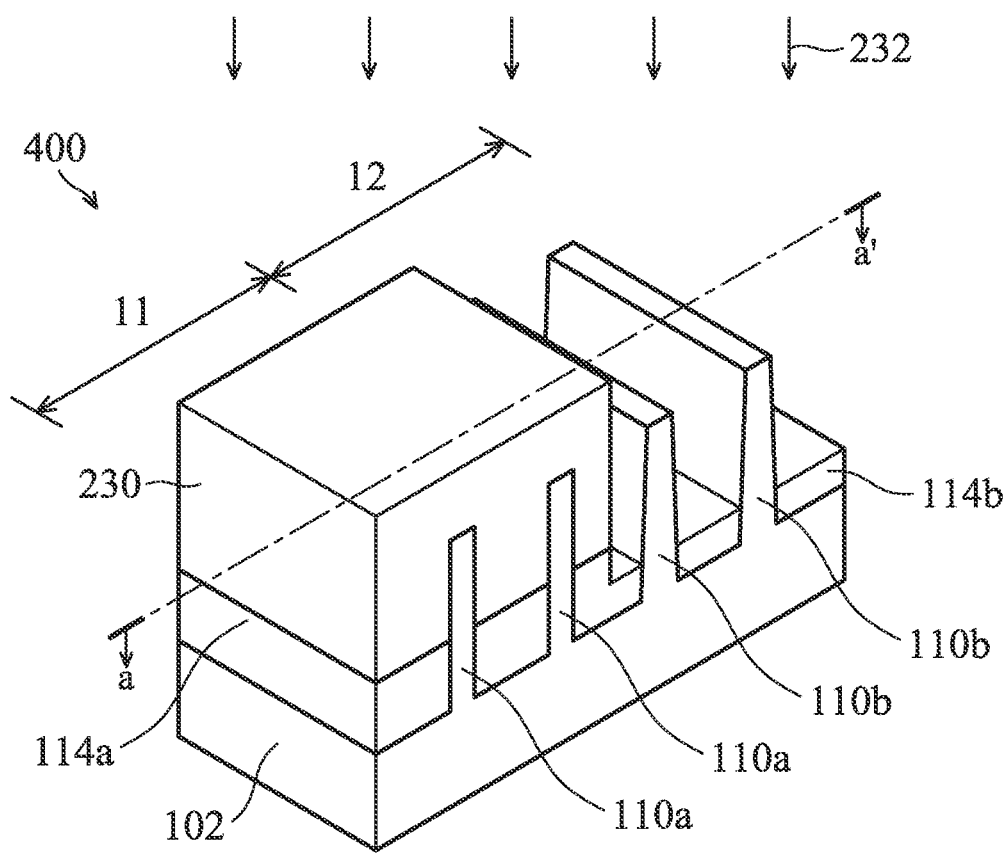
Figure 8C:
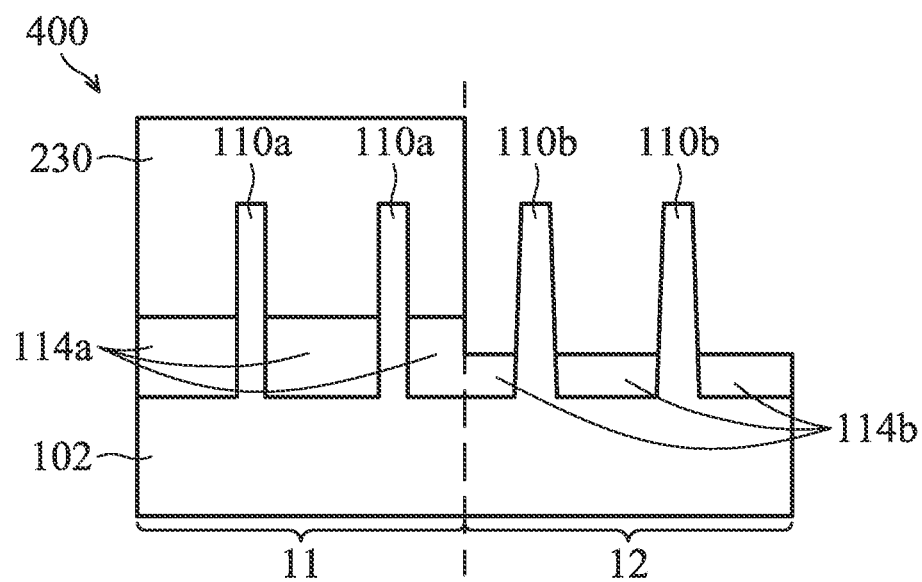

Afterwards, as shown in FIGS. 7C and 8C, a mask layer 230 is formed over the first fin structures 110*a* and the first isolation structures 114*a*, and a portion of the second isolation structures 114*b* is removed, in accordance with some embodiments. In some embodiments, an etching process 232 is performed on the second isolation structures 114*b* to remove the portion of the second isolation structures 114*b*.

Figure 7D:
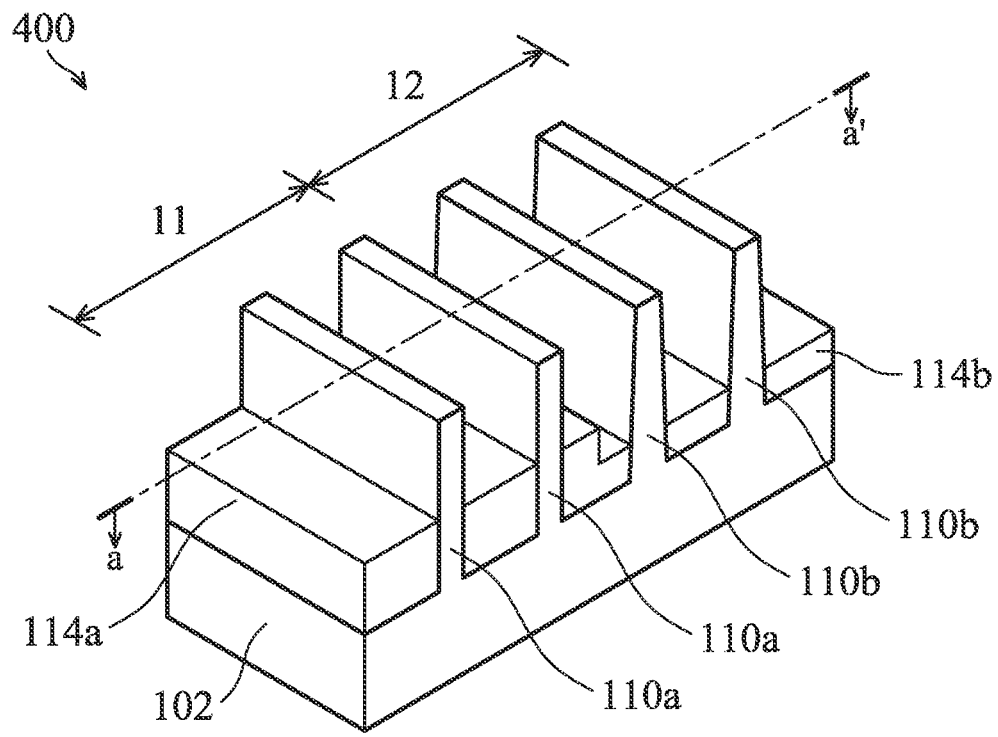
Figure 8D:
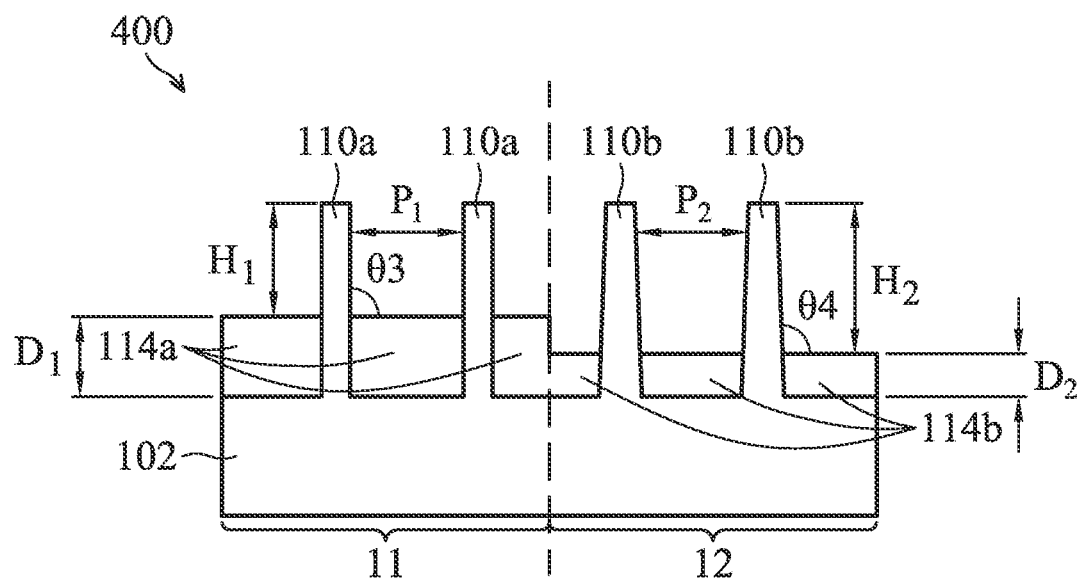

Next, as shown in FIGS. 7D and 8D, after the etching process 232, the mask layer 230 is removed, in accordance with some embodiments. The mask layer 230 may be removed by a dry etching process or a wet etching process.

The first fin structures 110*a* in the first region 11 and the second fin structures 110*b* in the second region 12 have different fin profiles and different fin heights. The second fin structures 110*b* in the second region 12 are etched twice and have sloped sidewall surfaces. Afterwards, the FinFET device structure 400 continues to form other devices and structures.

In the fourth embodiment, the FinFET device structure 400 is formed to have different fin profiles and different fin heights. The first fin structures 110*a* in the first region 11 have straighter sidewall surfaces and lower first fin height $H_1$ and the second fin structures 110*b* in the second region 12 have sloped sidewall surfaces and higher second fin height $H_2$. By forming different fin profiles and fin heights, the cutoff frequency (Ft) of FinFET device structure 400 is improved. Therefore, the FinFET device structure 400 can be used in the high-frequency device.

In the first embodiment, the first fin structures 110*a* and the second fin structures 110*b* have different fin heights. In the second embodiment, the first fin structures 110*a* and the second fin structures 110*b* have different fin profiles. In the third and fourth embodiments, the first fin structures 110*a* and the second fin structures 110*b* have different fin heights and have different fin profiles. By forming the different fin height and/or different fin profiles, the parasite capacitance (C) of the FinFET device structures 100, 200, 300, 400 may be reduced and therefore the cutoff frequency (Ft) of the FinFET device structures 100, 200, 300, 400 is improved.

Embodiments for forming a FinFET device structure and method for formation of the same are provided. The FinFET device structure includes an isolation structure formed over a substrate, and a fin structure extends from the isolation structure. The FinFET device structure with different fin heights is achieved by using two etching processes. A portion of the isolation structures is etched twice to control the etching amount more precisely. The FinFET device structure with different fin heights and/or different fin profiles to reduce the parasite capacitance (C) of the FinFET device structures. Therefore, the performance of the FinFET device structures is improved.

In some embodiments, a FinFET device structure is provided. The FinFET device structure includes a first fin structure and a second fin structure over a substrate. The first fin structure and the second fin structure have a first sidewall surface and a second sidewall surface respectively, and the first sidewall surface and the second sidewall surface extend along a first direction. The FinFET device structure also includes a third fin structure and a fourth fin structure over the substrate. The third fin structure and the fourth fin structure have a third sidewall surface and a fourth sidewall surface respectively, and the third sidewall surface and the fourth sidewall surface extend along a second direction different from the first direction. The FinFET device structure further includes a first isolation structure over the substrate and surrounding the first fin structure and the second fin structure. In addition, the FinFET device structure includes a second isolation structure over the substrate and surrounding the third fin structure and the fourth fin structure. A first distance between top portions of the third sidewall surface of the third fin structure and the fourth sidewall surface of the fourth fin structure is greater than a second distance between top portions of the first sidewall surface of the first fin structure and the second sidewall surface of the second fin structure.

In some embodiments, a method for forming a FinFET device structure is provided. The method includes forming a first fin structure and a second fin structure in a first region of a substrate and a third fin structure and a fourth fin structure in a second region of the substrate. The first fin structure and the second fin structure have a first sidewall surface and a second sidewall surface respectively, and the first sidewall surface and the second sidewall surface extend along a first direction, wherein the third fin structure and the fourth fin structure have a third sidewall surface and a fourth sidewall surface respectively, and the third sidewall surface and the fourth sidewall surface extend along a second direction different from the first direction. The method also includes forming an isolation layer covering the first fin structure, the second fin structure, the third fin structure and the fourth fin structure. The method further includes etching a first portion of the isolation layer to expose top portions of the first fin structure, the second fin structure, the third fin structure and the fourth fin structure. In addition, the method includes forming a mask layer over the first fin structure and the second fin structure after removing the first portion of the isolation layer. The method also includes etching a second portion of the isolation layer surrounding the third fin structure and the fourth fin structure to form an isolation structure on the substrate. A first top surface of the isolation structure surrounding the first sidewall surface of the first fin structure in the first region is higher than a second top surface of the isolation structure surrounding the third sidewall surface of the third fin structure in the second region. A first distance between top portions of the third sidewall surface of the third fin structure and the fourth sidewall surface of the fourth fin structure is greater than a second distance between top portions of the first sidewall surface of the first fin structure and the second sidewall surface of the second fin structure.

In some embodiments, a method for forming a FinFET device structure is provided. The method includes forming a first fin structure and a second fin structure in a first region and a second region of a substrate, respectively, wherein the first fin structure and the second fin structure have a first sloped sidewall surface and a second slope sidewall surface respectively, and the first slope sidewall surface and the second slope sidewall surface have a first slope. The method also includes forming a mask layer over the second fin structure. The method further includes removing a portion of the first fin structure, so that the first fin structure has a first modified sidewall surface, wherein the first modified sidewall surface has a second slope different from the first slope. In addition, the method includes removing the mask layer. The method also includes forming a first isolation structure surrounding the first fin structure in the first region and a second isolation structure surrounding the second fin structure in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
    forming a first fin structure and a second fin structure in a first region of a substrate and a third fin structure and a fourth fin structure in a second region of the substrate, wherein the first fin structure and the second fin structure have a first sidewall surface and a second sidewall surface respectively, and the first sidewall surface and the second sidewall surface extend along a first direction, wherein the third fin structure and the fourth fin structure have a third sidewall surface and a fourth sidewall surface respectively, and the third sidewall surface and the fourth sidewall surface extend along a second direction different from the first direction;
    forming an isolation layer covering top surfaces of the first fin structure, the second fin structure, the third fin structure and the fourth fin structure, wherein a first width of the isolation layer between top surfaces of the first fin structure and the second fin structure is different from a second width of the isolation layer between top surfaces of the third fin structure and the fourth fin structure;
    etching a portion of the isolation layer to form an isolation structure to expose top portions of the first fin structure, the second fin structure, the third fin structure and the fourth fin structure;
    wherein a first distance between top portions of the third sidewall surface of the third fin structure and the fourth sidewall surface of the fourth fin structure is greater than a second distance between top portions of the first sidewall surface of the first fin structure and the second sidewall surface of the second fin structure.

2. The method for forming the fin field effect transistor (FinFET) device structure as claimed in claim 1, further comprising:
    forming a patterned mask layer over the first fin structure, the second fin structure, the third fin structure and the fourth fin structure, wherein the isolation layer covers the patterned mask layer; and
    thinning the isolation layer to expose a top surface of the patterned mask layer.

3. The method for forming the fin field effect transistor (FinFET) device structure as claimed in claim 2, further comprising:
    forming a patterned dielectric layer between the patterned mask layer and the first fin structure, between the patterned mask layer and the second fin structure, between the patterned mask layer and the third fin structure, and between the patterned mask layer and the fourth fin structure.

4. The method for forming the fin field effect transistor (FinFET) device structure as claimed in claim 1, further comprising:

forming a gate dielectric layer over the first fin structure, the second fin structure, the third fin structure and the fourth fin structure; and forming a gate electrode layer over the gate dielectric layer.

5. The method for forming the fin field effect transistor (FinFET) device structure as claimed in claim 4, wherein a third distance between the gate dielectric layer on a top portion of the third sidewall surface of the third fin structure and the gate dielectric layer on a top portion of the fourth sidewall surface of the fourth fin structure is greater than a fourth distance between the gate dielectric layer on the top portion of the first sidewall surface of the first fin structure and the gate dielectric layer on the top portion of the second sidewall surface of the second fin structure.

6. The method for forming the fin field effect transistor (FinFET) device structure as claimed in claim 1, wherein the first sidewall surface of the first fin structure and the second sidewall surface of the second fin structure are straight sidewall surfaces.

7. The method for forming the fin field effect transistor (FinFET) device structure as claimed in claim 1, wherein the third sidewall surface of the third fin structure and the fourth sidewall surface of the fourth fin structure are sloped sidewall surfaces.

8. The method for forming the fin field effect transistor (FinFET) device structure as claimed in claim 1, wherein a top surface of the isolation structure extends along a third direction substantially orthogonal to the first direction.

9. The method for forming the fin field effect transistor (FinFET) device structure as claimed in claim 1, wherein a first depth of the isolation structure in the first region is substantially equal to a second depth of the isolation structure in the second region.

10. The method for forming the fin field effect transistor (FinFET) device structure as claimed in claim 1, wherein a top surface of the isolation structure in the first region is substantially level with a top surface of the isolation structure in the second region.

11. A method for forming a fin field effect transistor (FinFET) device structure, comprising:

forming a first fin structure and a second fin structure in a first region and a second region of a substrate, respectively, wherein the first fin structure and the second fin structure have a first sloped sidewall surface and a second slope sidewall surface respectively, and the first slope sidewall surface and the second slope sidewall surface have a first slope;

forming a mask layer over the second fin structure;

removing a portion of the first fin structure, so that the first fin structure has a first modified sidewall surface, wherein the first modified sidewall surface has a second slope different from the first slope;

removing the mask layer; and forming a first isolation structure surrounding the first fin structure in the first region and a second isolation structure surrounding the second fin structure in the second region, wherein a first fin height of the first fin structure from a top surface of the first fin structure to a top surface of the first isolation structure is substantially equal to a second fin height of the second fin structure from a top surface of the second fin structure to a top surface of the second isolation structure.

12. The method for forming the fin field effect transistor (FinFET) device structure as claimed in claim 11, wherein the second slope of the first modified sidewall surface of the first fin structure is substantially orthogonal to top surfaces of the first isolation structure and the second isolation structure.

13. The method for forming the fin field effect transistor (FinFET) device structure as claimed in claim 11, wherein the first fin structure has a constant width from a bottom portion to a top portion after removing the portion of the first fin structure.

14. The method for forming the fin field effect transistor (FinFET) device structure as claimed in claim 13, wherein the second fin structure has a tapered fin width which is tapered from a bottom portion to the top portion.

15. A method for forming a fin field effect transistor (FinFET) device structure, comprising:

forming a first fin structure and a second fin structure in a first region of a substrate and a third fin structure and a fourth fin structure in a second region of the substrate, wherein the first fin structure, the second fin structure, the third fin structure and the fourth fin structure each has a first fin width gradually decreasing from bottom portions to top portions of the first fin structure, the second fin structure, the third fin structure and the fourth fin structure;

etching portions of the first fin structure and the second fin structure, wherein a first pitch between the first fin structure and the second fin structure is different from a second pitch between the third fin structure and the fourth fin structure after etching; and forming an isolation structure surrounding the first fin structure, the second fin structure, the third fin structure and the fourth fin structure, wherein a first depth of the isolation structure in the first region is substantially equal to a second depth of the isolation structure in the second region.

16. The method for forming the fin field effect transistor (FinFET) device structure as claimed in claim 15, wherein a second fin width of the bottom portion of the first fin structure is substantially equal to a third fin width of the top portion of the first fin structure after etching portions of the first fin structure and the second fin structure.

17. The method for forming the fin field effect transistor (FinFET) device structure as claimed in claim 15, further comprising:

forming a mask layer over the third fin structure and the fourth fin structure before etching.

18. The method for forming the fin field effect transistor (FinFET) device structure as claimed in claim 17, further comprising:

removing the mask layer after etching portions of the first fin structure and the second fin structure.

19. The method for forming the fin field effect transistor (FinFET) device structure as claimed in claim 15, wherein etching portions of the first fin structure and the second fin structure comprises a dry etching process.

20. The method for forming the fin field effect transistor (FinFET) device structure as claimed in claim 15, wherein after etching the portions of the first fin structure and the second fin structure, a first angle between a first sidewall surface of the first fin structure and a top surface of the isolation structure and a second angle between a second sidewall surface of the second fin structure and the top surface of the isolation structure are smaller than a third angle between a third sidewall surface of the third fin structure and the top surface of the isolation structure and a fourth angle between a fourth sidewall surface of the fourth fin structure and the top surface of the isolation structure.

\* \* \* \* \*